United States Patent [19]

Dykema et al.

[11] Patent Number: 5,699,055
[45] Date of Patent: Dec. 16, 1997

[54] TRAINABLE TRANSCEIVER AND METHOD FOR LEARNING AN ACTIVATION SIGNAL THAT REMOTELY ACTUATES A DEVICE

[75] Inventors: Kurt A. Dykema; Paul C. Duckworth, both of Holland, Mich.

[73] Assignee: Prince Corporation, Holland, Mich.

[21] Appl. No.: 446,085

[22] Filed: May 19, 1995

[51] Int. Cl.$^6$ .................................................. G05B 19/02
[52] U.S. Cl. ................... 340/825.22; 340/825.69; 340/825.72; 455/151.2; 341/176
[58] Field of Search ................... 340/825.22, 825.69, 340/825.72, 825.71, 825.44, 825.31; 455/151.2, 285, 115, 116; 341/176

[56] References Cited

U.S. PATENT DOCUMENTS

| | | |
|---|---|---|
| Re. 29,525 | 1/1978 | Wilmott . |
| 3,337,992 | 8/1967 | Tolson . |
| 4,178,549 | 12/1979 | Ledenbach et al. . |
| 4,197,503 | 4/1980 | Dini . |
| 4,201,944 | 5/1980 | Beunders . |
| 4,241,870 | 12/1980 | Marcus . |
| 4,247,850 | 1/1981 | Marcus . |
| 4,360,801 | 11/1982 | Duhame . |
| 4,385,296 | 5/1983 | Tsubaki et al. . |
| 4,427,847 | 1/1984 | Hofmann et al. . |
| 4,447,808 | 5/1984 | Marcus . |
| 4,482,947 | 11/1984 | Zato et al. . |
| 4,509,093 | 4/1985 | Stellberger . |
| 4,529,980 | 7/1985 | Liotine et al. . |
| 4,535,333 | 8/1985 | Twardowski . |
| 4,595,228 | 6/1986 | Chu . |
| 4,596,985 | 6/1986 | Bongard et al. . |
| 4,623,887 | 11/1986 | Welles, II . |
| 4,626,848 | 12/1986 | Ehlers . |
| 4,631,708 | 12/1986 | Wood et al. . |
| 4,635,033 | 1/1987 | Inukai et al. . |
| 4,652,860 | 3/1987 | Weishaupt et al. . |
| 4,670,746 | 6/1987 | Taniguchi et al. . |
| 4,703,359 | 10/1987 | Rumbolt et al. . |
| 4,750,118 | 6/1988 | Heitschel et al. . |
| 4,754,255 | 6/1988 | Sanders et al. . |
| 4,771,283 | 9/1988 | Imoto . |

(List continued on next page.)

FOREIGN PATENT DOCUMENTS 9402920  2/1994  WIPO .

OTHER PUBLICATIONS

Kari, Risto, "Fast Training of a High–Speed voiceband Data Modem Receiver," Doctoral Dissertation, Helinski, 1990, pp. 21, 83–99.

Madni, Asad M. et al., "High–Dynamic–Range Airborne Tracking and Fire Control Radar Subsystems," *IEEE,* vol. 37, No. 12, Dec. 1989, pp. 1942–1948.

Foltz, Capt. Thomas M. et al., "A Digital Single Sideband Modulator for a Digital Radio Frequency Memory," pp. 926–932.

Ooi, T. H. et al., "Low Cost RF Identification and Locating System," *IEEE,* vol. 35, No. 4, Nov. 1989, pp. 831–839.

Vaccani, Paul, "Occupancy Measurement Methods in the Radio Frequency Spectrum and Their Use," pp. 242–246.

Herman, Ray A. et al. "A GPS Receiver with Synthesized Local Oscillator," *IEEE,* 1989, pp. 194–195, 339.

Gail Marino, Pager and Garage Door Combination, Mar. 1990, Motorola Technical Developments, vol. 10 p. 36 (1 p.).

*Primary Examiner*—Edwin C. Holloway, III
*Attorney, Agent, or Firm*—Price, Heneveld, Cooper, DeWitt & Litton

[57] ABSTRACT

A trainable transceiver for learning and transmitting an activation signal that includes an RF carrier frequency modulated with a code for remotely actuating a device, such as a garage door opener. The trainable transceiver includes a frequency table including a list of frequencies for remote transmitters known to transmit for only a short duration and the trainable transceiver first reads the short duration frequencies from the frequency table. The trainable transceiver may additionally include a prompting circuit for prompting an operator to cause a remote transmitter to retransmit its activation signal if the activation signal ceases before training is complete.

17 Claims, 18 Drawing Sheets

U.S. PATENT DOCUMENTS

| | | |
|---|---|---|
| 4,825,200 | 4/1989 | Evans et al. . |
| 4,866,434 | 9/1989 | Keenan . |
| 4,872,205 | 10/1989 | Smith . |
| 4,878,052 | 10/1989 | Schulze . |
| 4,881,148 | 11/1989 | Lambropoulos et al. . |
| 4,890,108 | 12/1989 | Drori et al. . |
| 4,905,279 | 2/1990 | Nishio . |
| 4,912,463 | 3/1990 | Li . |
| 4,929,877 | 5/1990 | Clark et al. . |
| 4,953,305 | 9/1990 | Van Lente et al. . |
| 4,978,944 | 12/1990 | Andros et al. . |
| 4,988,992 | 1/1991 | Heitschel et al. . |
| 5,028,919 | 7/1991 | Hidaka . |
| 5,065,423 | 11/1991 | Gaskill . |
| 5,123,008 | 6/1992 | Beesley . |
| 5,126,686 | 6/1992 | Tam . |
| 5,136,548 | 8/1992 | Claar et al. . |
| 5,182,551 | 1/1993 | Goto . |
| 5,227,780 | 7/1993 | Tigwell . |
| 5,235,327 | 8/1993 | Igarashi et al. . |
| 5,262,769 | 11/1993 | Holmes . |
| 5,266,945 | 11/1993 | Peek et al. . |
| 5,379,453 | 1/1995 | Tigwell . |
| 5,381,138 | 1/1995 | Stair et al. . |
| 5,442,340 | 8/1995 | Dykema . |
| 5,444,499 | 8/1995 | Saitoh . |
| 5,475,366 | 12/1995 | Van Lente et al. . |
| 5,479,155 | 12/1995 | Zeinstra et al. . |
| 5,564,101 | 10/1996 | Eisfeld et al. . |
| 5,583,485 | 12/1996 | Van Lente et al. . |

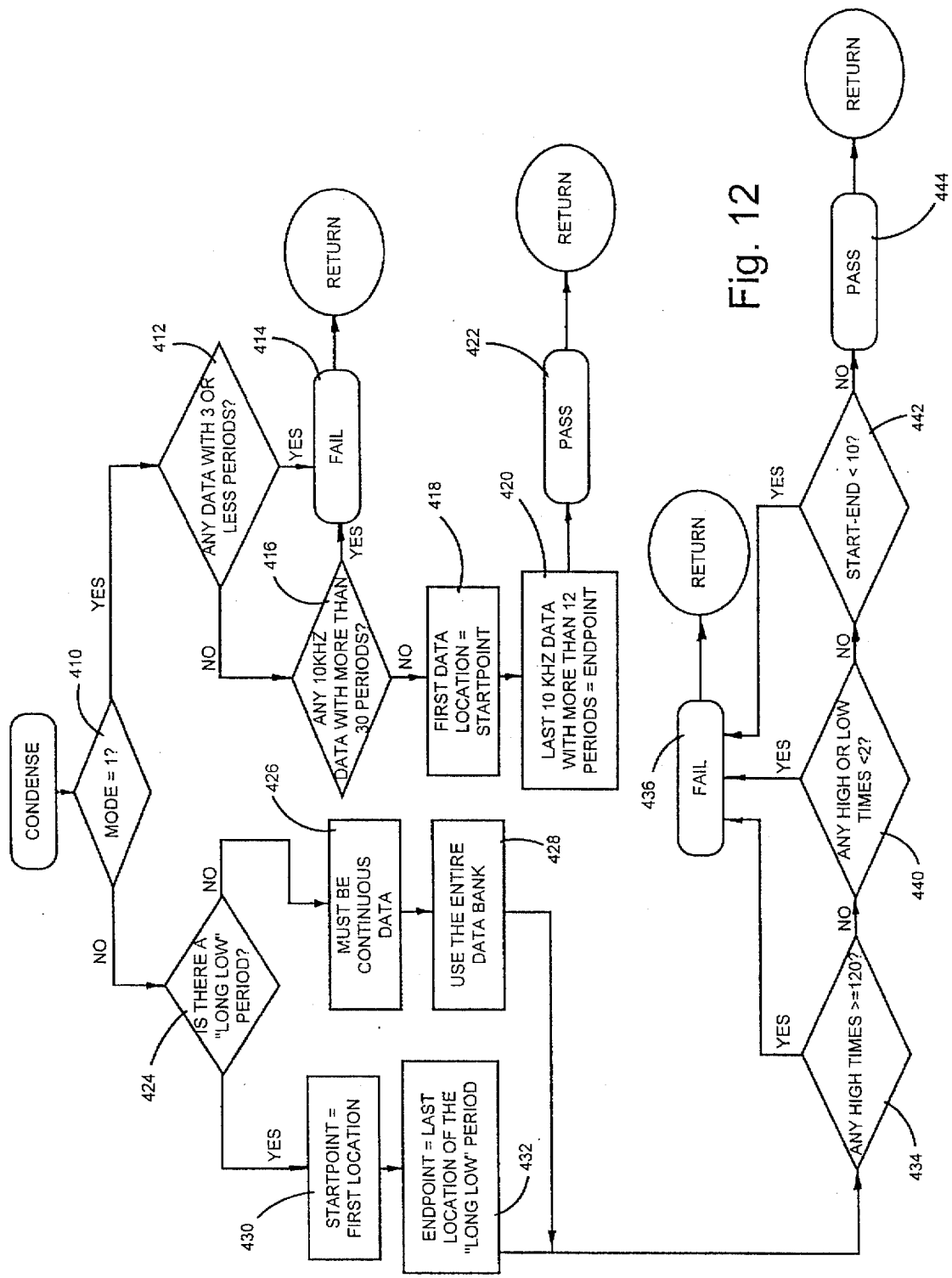

TRAINABLE TRANSCEIVER AND METHOD FOR LEARNING AN ACTIVATION SIGNAL THAT REMOTELY ACTUATES A DEVICE

BACKGROUND OF THE INVENTION

The present invention relates to a trainable radio frequency (RF) transceiver and particularly to a trainable transceiver including a dynamically tunable antenna, a trainable transceiver including a phase-locked loop circuit, a trainable transceiver including a variable gain amplifier, or a trainable transceiver capable of learning transmitted RF signals of short duration.

Electrically operated garage door opening mechanisms are an increasingly popular home convenience. Such garage door opening mechanisms typically employ a battery-powered portable RF transmitter for transmitting a modulated and encoded RF signal to a separate receiver located within the homeowner's garage. Each garage door receiver is tuned to the frequency of its associated remote transmitter and demodulates a predetermined code programmed into both the remote transmitter and the receiver for operating the garage door. Conventional remote transmitters have consisted of a portable housing which typically is clipped to a vehicle's visor or otherwise loosely stored in the vehicle. Over a period of years of use in a vehicle, these remote transmitters are lost, broken, become worn, dirty, and their mounting to a visor is somewhat unsightly. Also, they pose a safety hazard if not properly secured within a vehicle.

To solve some of these problems, U.S. Pat. No. 4,247,850 discloses a remote transmitter incorporated into a vehicle's visor and U.S. Pat. No. 4,447,808 discloses a remote transmitter incorporated in the vehicle's rearview mirror assembly. Incorporating a remote transmitter permanently in a vehicle accessory requires an associated receiving unit tuned to the same frequency as the transmitter and responsive to its modulation scheme and code to be purchased and installed in the vehicle owner's home. Vehicle owners who already own a garage door receiving unit are reluctant to purchase a new receiving unit associated with the remote transmitter permanently incorporated in their vehicle. Moreover, if a vehicle owner purchases a new car it is likely the owner would have to replace the garage door receiver with another one associated with the built-in remote transmitter in the new vehicle.

U.S. Pat. No. 4,241,870 discloses a housing built in an overhead console of a vehicle for removably receiving a specially adapted garage door remote transmitter such that the vehicle's battery provides operating power to the remote transmitter. Thus, when a vehicle owner purchases a new car, the remote transmitter may be removed from the old car and placed in the new car. However, the housing in the overhead console is not mechanically adapted to receive existing garage door remote transmitters, and therefore, the vehicle owner must purchase a specially adapted remote transmitter and an associated receiver.

U.S. Pat. No. 4,595,228 discloses an overhead console for a vehicle having a compartment with a drop down door for removably receiving an existing garage door remote transmitter. The door includes a panel which is movable for actuating the switch of the stored existing remote transmitter. A problem with this approach, however, is that remote transmitters for garage door openers vary considerably in shape and size and it is difficult to provide a housing that is mechanically compatible with the various brands of remote transmitters.

To solve all of the above problems, a trainable transceiver has been developed for incorporation in a universal garage door opener to be permanently located in a vehicle and powered by the vehicle's battery. This trainable transceiver is capable of learning the radio frequency, modulation scheme, and data code of an existing portable remote RF transmitter associated with an existing receiving unit located in the vehicle owner's garage. Thus, when a vehicle owner purchases a new car having such a trainable transceiver, the vehicle owner may train the transmitter to the vehicle owner's existing clip-on remote RF transmitter without requiring any new installation in the vehicle or home. Subsequently, the old clip-on transmitter can be discarded or stored.

If a different home is purchased or an existing garage door opener is replaced, the trainable transceiver may be retrained to match the frequency and code of any new garage door opener receiver that is built into the garage door opening system or one which is subsequently installed. The trainable transceiver can be trained to any remote RF transmitter of the type utilized to actuate garage door opening mechanisms or other remotely controlled devices such as house lights, access gates, and the like. It does so by learning not only the code and code format (i.e., modulation scheme), but also the particular RF carrier frequency of the signal transmitted by any such remote transmitter. After being trained, the trainable transceiver actuates the garage door opening mechanism without the need for the existing separate remote transmitter. Because the trainable transceiver is an integral part of a vehicle accessory, the storage and access difficulties presented by existent "clip-on" remote transmitters are eliminated. Such a trainable transceiver is disclosed in U.S. Pat. No. 5,442,340 and entitled "TRAINABLE RF TRANSMITTER INCLUDING ATTENUATION CONTROL."

Such trainable transceivers, however, have experienced difficulty in learning the frequency and code of a remote transmitter of a type formerly used in Canada because such Canadian remote transmitters transmit an RF actuation signal of a very short duration (i.e., approximately two seconds) due to regulations imposed by the Canadian government. Further, existing trainable transceivers are complex and have required a large number of electrical components that have been mounted on multiple circuit boards. In addition, existing trainable transceivers transmit at powers below that permitted by the Federal Communications Commission (FCC) due to undesirable levels of harmonics transmitted with the RF signal having the desired carrier frequency. As a result, their range of operation can be somewhat limited, a frustration for the operator. Moreover, this operating range is not enhanced by the fact that existing trainable transceivers include a small loop or strip antenna that is efficient for only limited ranges of transmitted or received frequencies.

SUMMARY OF THE INVENTION

The present invention solves the above problems and has the advantage of being more easily assembled and lower in manufacturing cost. An aspect of the present invention is to provide a trainable transceiver that is capable of learning a transmitted RF signal of very short duration. To achieve these and other advantages, the trainable transceiver of the present invention includes a memory, a controller, a signal generator, and receiving means. The memory stores a frequency table including a first list of carrier frequencies for activation signals transmitted from remote transmitters that are known to transmit an activation signal of a short duration. The controller is coupled to the memory and is operable in a learning and an operating mode. In the learning mode, the controller reads a first frequency from the first list in the frequency table and generates and stores frequency control data related to the frequency read from the frequency table. The signal generator is coupled to the controller for receiving the frequency control data from the controller and for generating a reference radio frequency signal having a frequency related to the frequency control data. The receiving means is coupled to the controller and the signal generator for receiving an activation signal, comparing the carrier frequency of the received activation signal with the frequency of the reference radio frequency signal output from the signal generator, and providing a code signal representing the code contained in the received activation signal when a predetermined relationship exists between the carrier frequency of the received activation signal and the frequency of the reference radio frequency signal.

The controller sequentially reads each frequency from the first list in the frequency table and generates and provides frequency control data to the signal generator until the controller receives and stores the code signal from the receiving means or until the controller has read every frequency included in the first list when in the learning mode. The controller provides the stored modulated code signal and frequency control data to the signal generator when in the operating mode, to generate and transmit a modulated radio frequency signal related to the received activation signal.

These and other features, objects, and benefits of the invention will be recognized by those who practice the invention and by those skilled in the art, from reading the following specification and claims together with reference to the accompanying drawing figures.

BRIEF DESCRIPTION OF THE DRAWINGS

FIG. 12 is a flow diagram of a condensing subroutine utilized in the training programming performed by the microcontroller shown in FIGS. 5 and 6A.

DETAILED DESCRIPTION OF THE PREFERRED EMBODIMENTS

Figure 2:
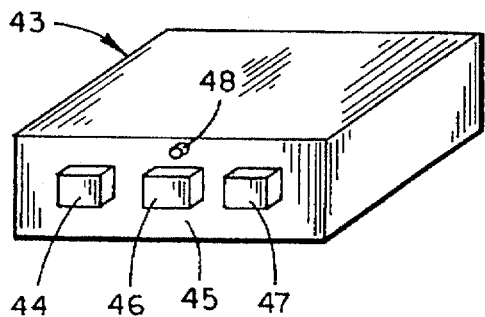
FIG. 2 is a perspective view of a trainable transceiver of the present invention.
Figure 1:
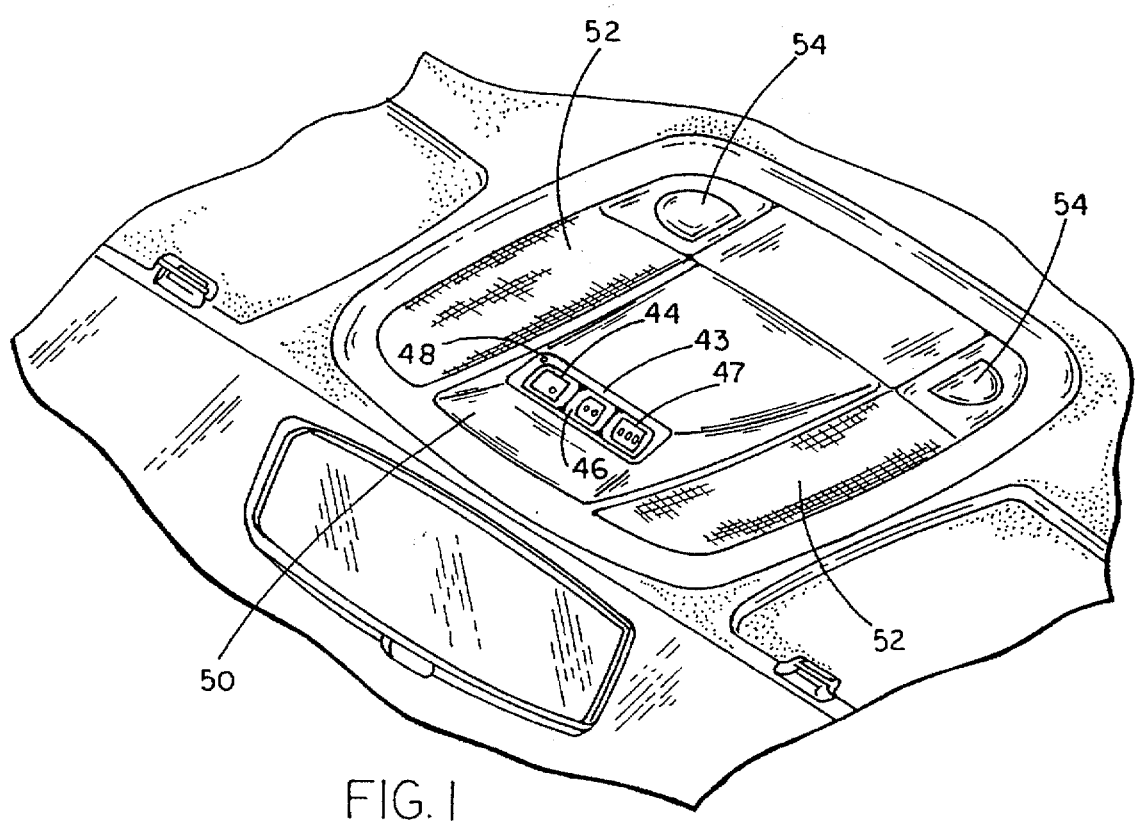
FIG. 1 is a fragmentary perspective view of a vehicle interior having an overhead console for housing the trainable transceiver of the present invention.

FIG. 2 shows a trainable transceiver 43 of the present invention. Trainable transceiver 43 includes three pushbutton switches 44, 46, and 47, a light emitting diode (LED) 48, and an electrical circuit board and associated circuits that may be mounted in a housing 45. As explained in greater detail below, switches 44, 46, and 47 may each be associated with a separate garage door or other device to be controlled. Trainable transceiver housing 45 is preferably of appropriate dimensions for mounting within a vehicle accessory such as an overhead console 50 as shown in FIG. 1. In the configuration shown in FIG. 1, trainable transceiver 43 includes electrical conductors coupled to the vehicle's electrical system for receiving power from the vehicle's battery. Overhead console 50 includes other accessories such as map reading lamps 52 controlled by switches 54. It may also include an electronic compass and display (not shown).

Figure 3:
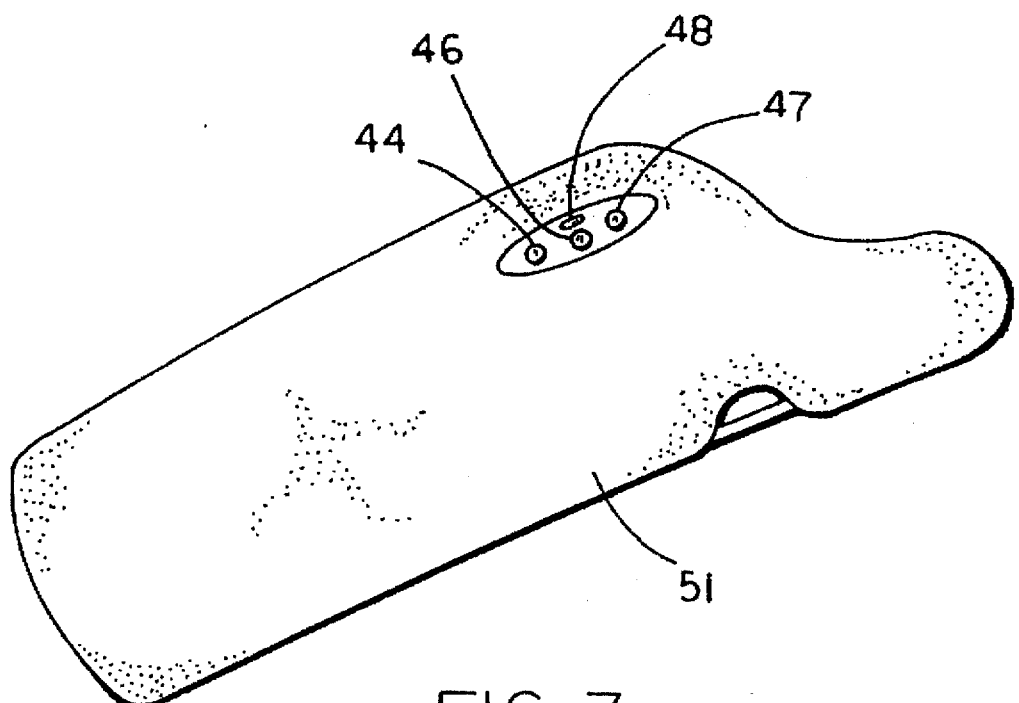
FIG. 3 is a perspective view of a visor incorporating the trainable transceiver of the present invention.
Figure 4:
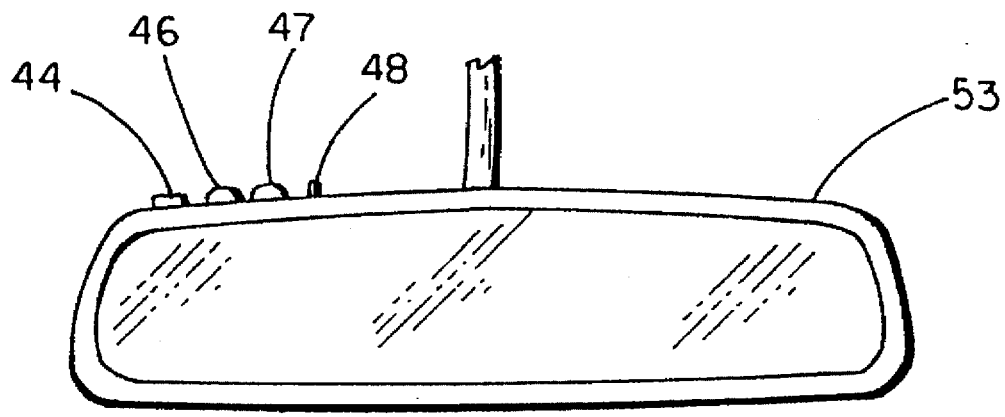
FIG. 4 is a perspective view of a mirror assembly incorporating the trainable transceiver of the present invention.

Trainable transceiver 43 may alternatively be permanently incorporated in a vehicle accessory such as a visor 51 (FIG. 3) or a rearview mirror assembly 53 (FIG. 4). Although trainable transceiver 43 has been shown as incorporated in a visor and mirror assembly and removably located in an overhead console compartment, trainable transceiver 43 could be permanently or removably located in the vehicle's instrument panel or any other suitable location within the vehicle's interior.

Figure 5:
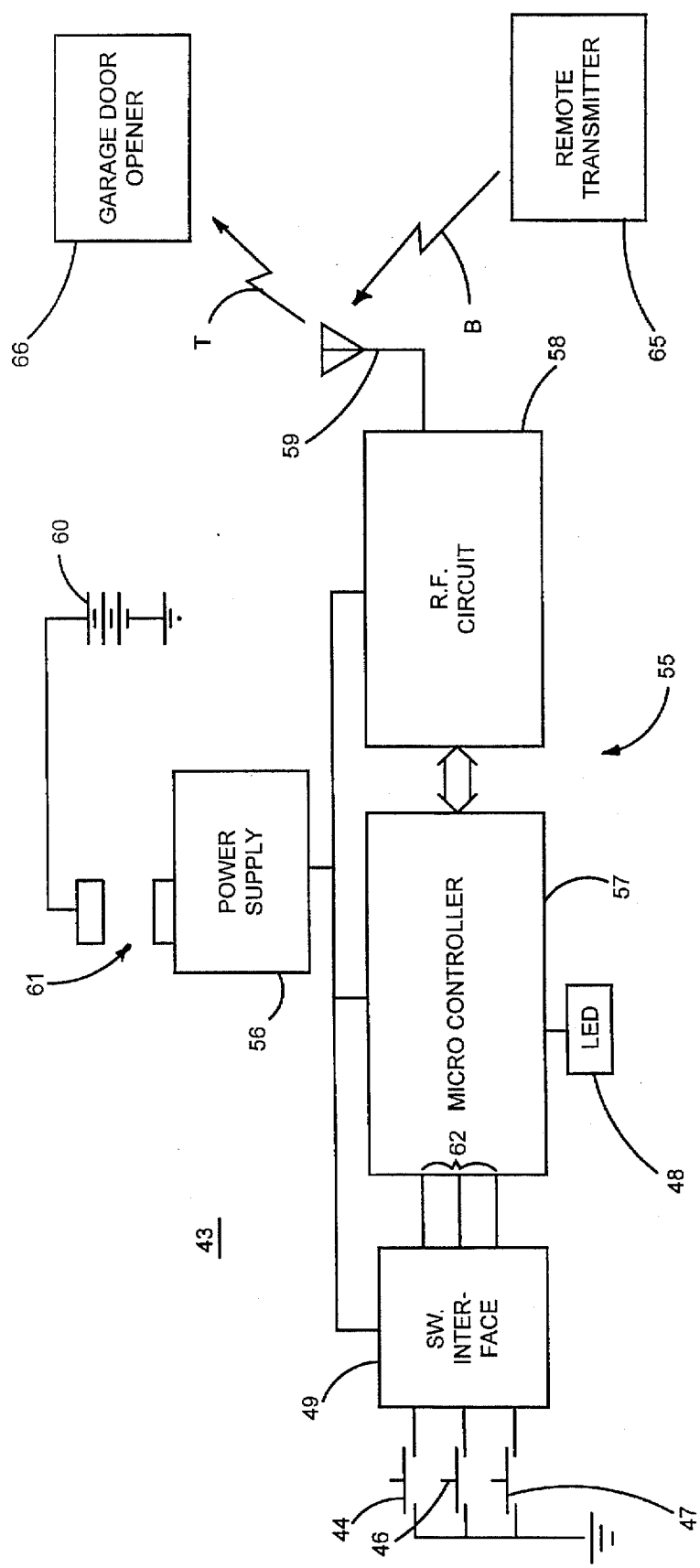
FIG. 5 is an electrical circuit diagram partly in block and schematic form of the trainable transceiver of the present invention.

FIG. 5 shows the electrical circuit of trainable transceiver 43 in block and schematic form. Trainable transceiver 43 includes a conventional switch interface circuit 49 connected to one terminal of each of the pushbutton switches 44, 46, and 47, which each have their remaining terminal coupled to ground. Interface circuit 49 couples signal information from switches 44, 46, and 47 to the input terminals 62 of a microcontroller 57, which is part of trainable transceiver circuit 55. A power supply 56 is conventionally coupled to the vehicle's battery 60 through connector 61 and is coupled to the various components of trainable transceiver circuit 55 for supplying their necessary operating power in a conventional manner. In addition to microcontroller 57, transceiver circuit 55 includes a radio frequency (RF) circuit 58 coupled to microcontroller 57 and to an antenna 59.

As described above, switches 44, 46, and 47 may each correspond to a different device to be controlled such as different garage doors, electrically operated access gates, house lighting controls or the like, each of which may have their own unique operating RF frequency, modulation scheme, and/or security code. Thus, switches 44, 45, and 47 correspond to a different radio frequency channel for trainable transceiver 43. Once the RF channel associated with one of switches 44, 46, and 47 has been trained to an RF activation signal B transmitted from a portable, remote transmitter 65 associated with a garage door opener 66 (for example), transceiver 43 will then transmit an RF signal T having the same characteristics as activation signal B to actuate a device such as garage door opener 66 when the corresponding switch (44, 46, 47) is momentarily depressed. Thus, by identifying and storing the carrier frequency, modulation scheme, and data code of a received RF activation signal B originating from a remote transmitter 65, transceiver 43 may subsequently transmit an RF signal T having the identified characteristics of RF signal B that are necessary to activate a device such as garage door opener 66. Each RF channel may be trained to a different RF signal B such that a plurality of devices in addition to a garage door opener 66 may be activated by depressing a corresponding one of switches 44, 46, and 47. Such other devices may include additional garage door openers, a building's interior or exterior lights, a home security system, or any other household appliance capable of receiving an RF control signal.

Microcontroller 57 includes data input terminals 62 for receiving signals from switch interface 49 indicative of the closure states of switches 44, 46, and 47. Microcontroller 57 is additionally has an output coupled to an LED 48, which is illuminated when one of switches 44, 46, and 47 is closed. Microcontroller 57 is programmed to provide signals to LED 48 to slowly flash when the circuit enters a training mode for one of the RF channels associated with switches 44, 46, and 47, to rapidly flash when a channel is successfully trained, and to slowly flash with a distinctive double blink to prompt an operator to reactuate the remote transmitter. Alternatively, LED 48 may be a multi-color LED that changes color to indicate when a channel is successfully trained or to prompt the operator to reactuate the remote transmitter. Once trainable transceiver 43 is trained, LED 48 lights continuously upon action of a switch 44, 46, or 47 during its depression to indicate to the user that the transceiver is transmitting a signal T.

Figure 6A:
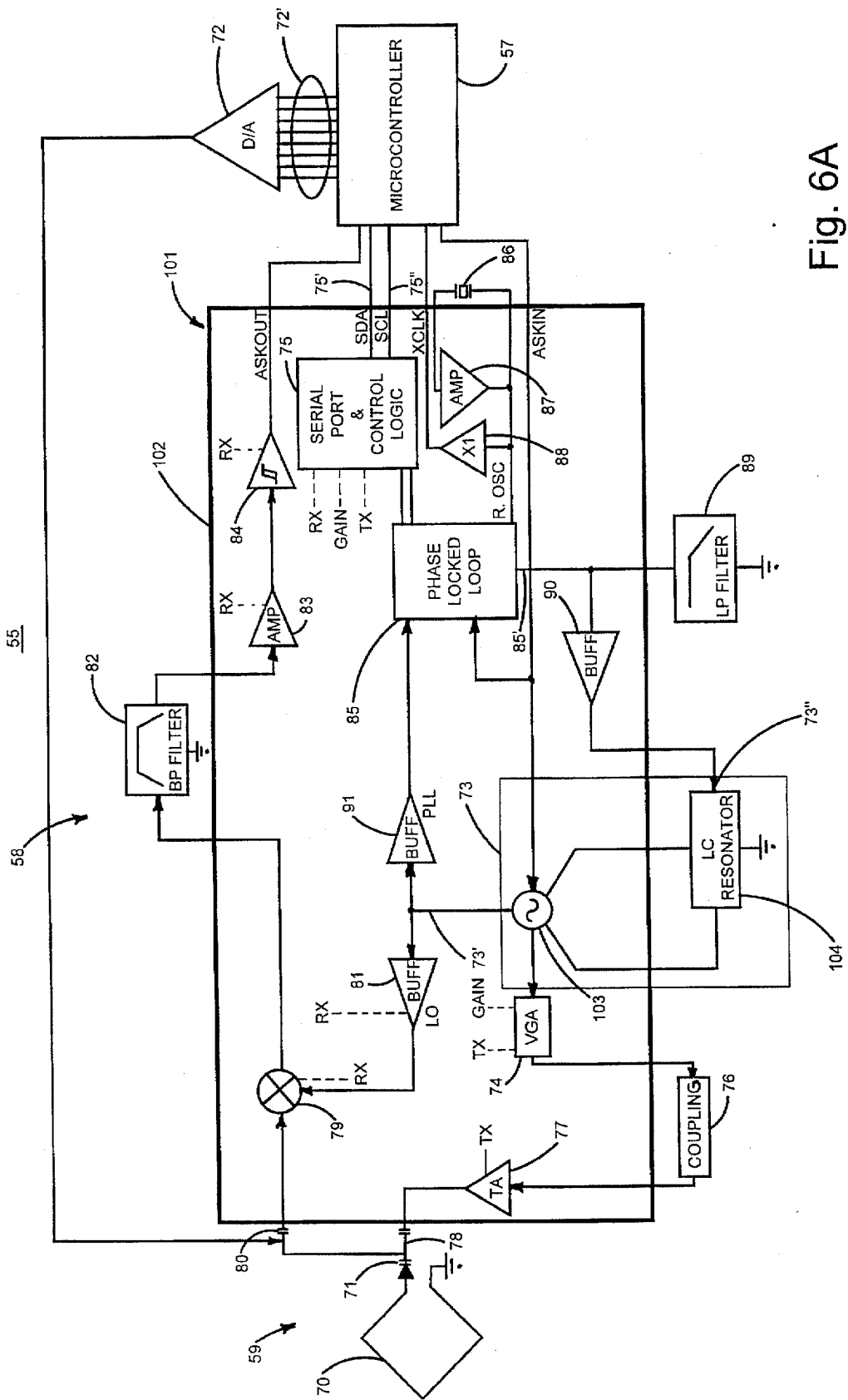
FIG. 6A is an electrical circuit diagram partly in block and schematic form showing details of the circuit shown in FIG. 5.

FIG. 6A shows the details of transceiver circuit 55, which includes microcontroller 57, RF circuit 58, and antenna 59. Microcontroller 57 includes a non-volatile memory (NVM) and a random access memory (RAM) and may include any suitable commercially available integrated circuit such as a MC6805P4 integrated circuit available from Motorola.

Antenna 59 is preferably a dynamically tunable antenna including a small loop antenna 70 having one terminal coupled to ground and another terminal coupled to the anode of a varactor diode 71. Varactor diode 71 changes the impedance characteristics of loop antenna 70 in response to a control voltage applied to the cathode of varactor diode 71 and thereby changes the resonance frequency of small loop antenna 70. This control voltage is determined by microcontroller 57, which provides an antenna control digital output signal to the input terminals 72' of a digital-to-analog (D/A) converter 72 that is coupled to the cathode of varactor diode 71. By using an antenna that is dynamically tuned, one may program microcontroller 57 to selectively adjust the resonance frequency of antenna 59 to maximize its transmission and reception characteristics for each particular frequency at which an RF signal is transmitted or received.

Figure 8:
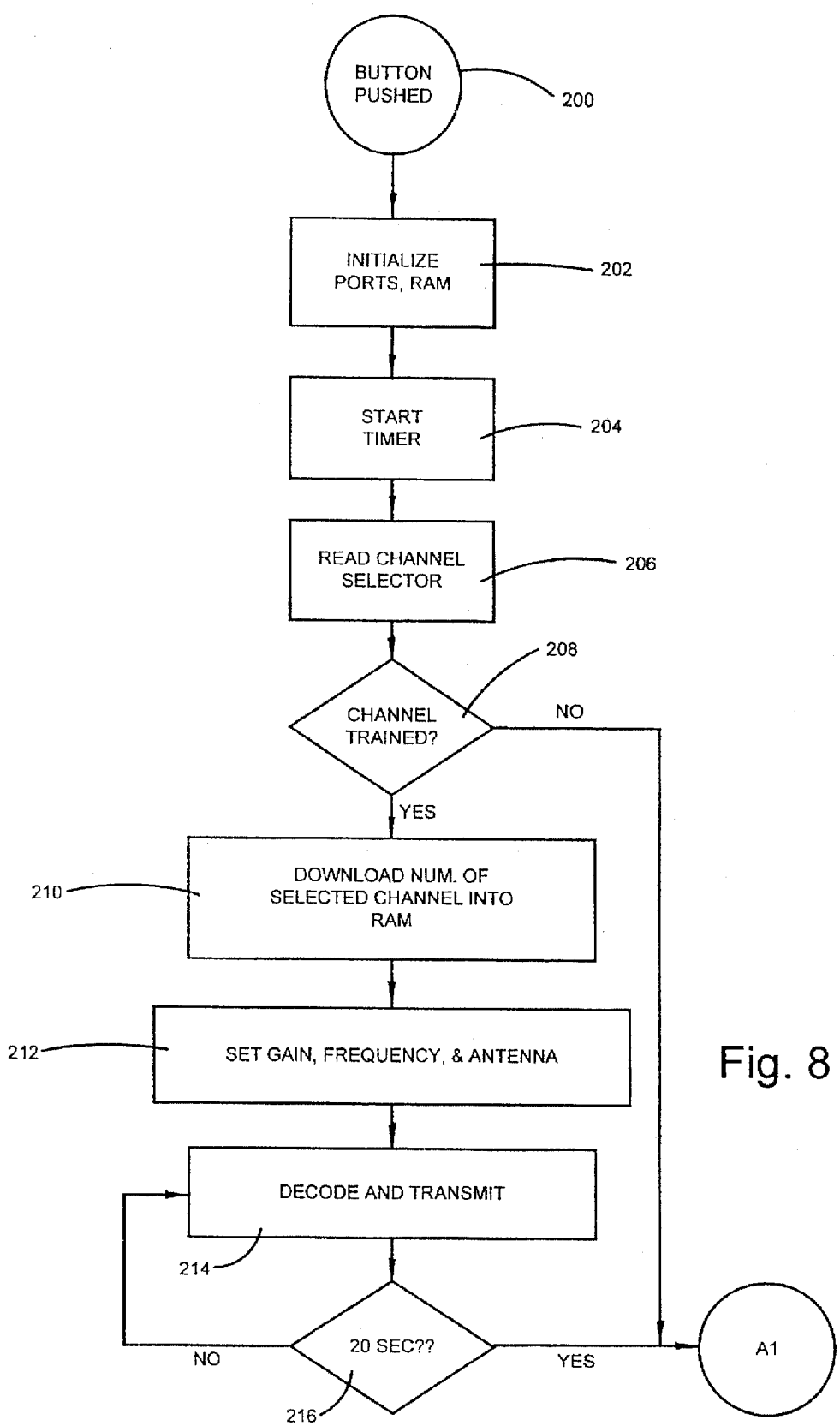
FIG. 8 is a flow diagram of the programming for the microcontroller shown in FIGS. 5 and 6A.

Thus, antenna 59 may be dynamically tuned to maximize the efficiency at which antenna 59 converts a received electromagnetic RF signal to an electrical signal during a receive mode and the efficiency at which antenna 59 radiates a transmitted electromagnetic RF signal in a transmit mode. Additionally, when antenna 59 is dynamically tuned to a resonance frequency corresponding to the carrier frequency of the transmitted signal, antenna 59 can remove unwanted harmonics from the signal to be transmitted. Preferably, loop antenna 70 is disposed perpendicular to the vehicle's roof to take advantage of the reflective properties of the roof thereby increasing the transmission range and sensitivity of the transceiver when located in a vehicle. The manner in which microcontroller 57 controls antenna 59 is described below in connection with the flow diagram shown in FIG. 8.

Figure 6B:
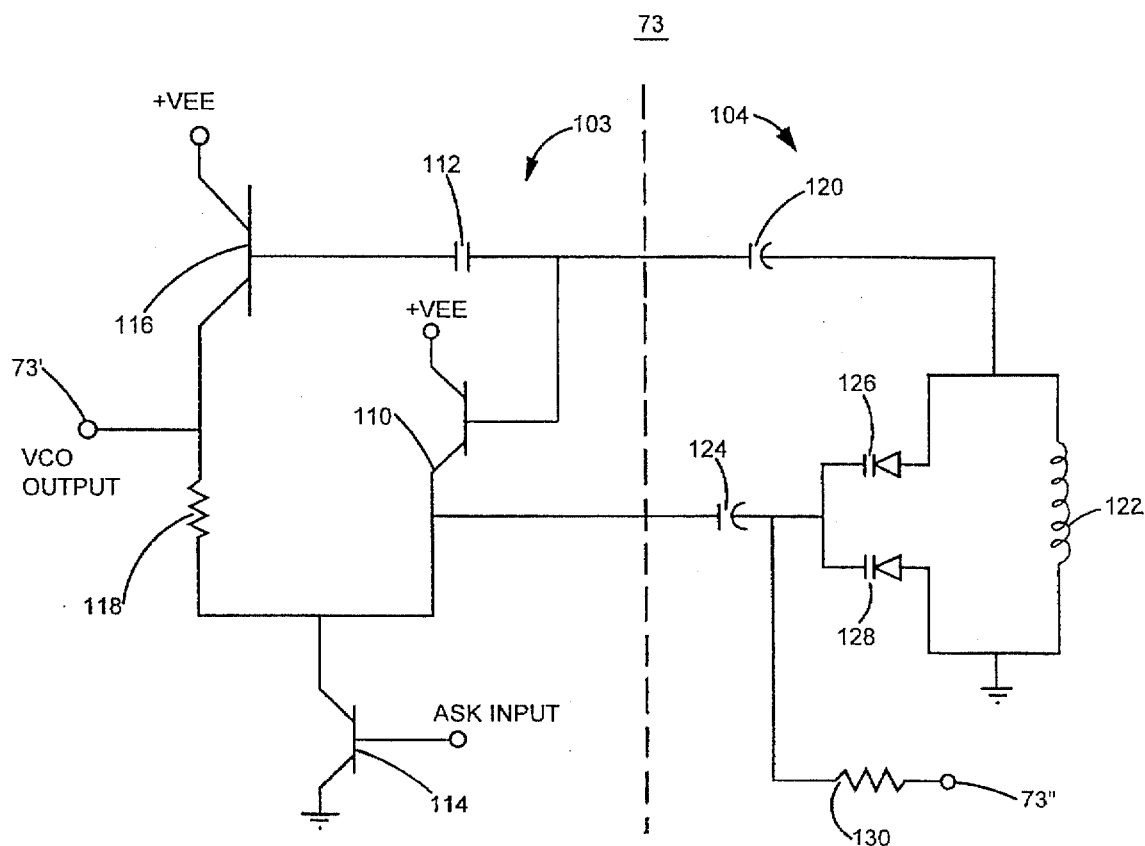
FIG. 6B is an electrical circuit diagram in schematic form showing the details of the voltage controlled oscillator shown in FIG. 6A.

Coupled to antenna 59 for transmitting learned RF control signals is an RF circuit 58, which includes a voltage controlled oscillator (VCO) 73 having a control input terminal coupled to a data output terminal of microcontroller 57 for controlling the frequency output by VCO 73. The detailed construction of a VCO suitable for use in the present invention is shown in FIG. 6B.

VCO 73 includes two portions-an oscillator 103, which outputs a sinusoidal signal that may be modulated by ASK data, and an LC resonator 104, which provides a variable frequency resonating signal to oscillator 103. Oscillator 103 includes an oscillating transistor 110 having a collector coupled to a positive source voltage $V_{EE}$, a base coupled to a first terminal of a capacitor 112, and an emitter coupled to ground via a switching transistor 114. A buffer transistor 116 has a base coupled to a second terminal of capacitor 112, a collector coupled to a positive source voltage $V_{EE}$, and an emitter coupled to a first terminal of a resistor 118, which has a second terminal connected to ground via switching transistor 114. Switching transistor 114 has its base coupled to receive ASK data from microcontroller 57 such that switching transistor 114 selectively couples the emitters of transistors 110 and 116 to ground. Thus, switching transistor 114 selectively modulates the signal at VCO output 73' provided at the emitter of buffer transistor 116.

LC resonator 104 includes a first coupling capacitor 120 having one terminal coupled to the base of oscillating transistor 110 and another terminal coupled to a first terminal of an inductor 122. A second coupling capacitor 124 has one terminal coupled to the emitter of oscillating transistor 110 and another terminal coupled to the cathodes of first and second varactor diodes 126 and 128. The anode of first varactor diode 126 is coupled to the first terminal of inductor 122 and first coupling capacitor 120 and the anode of second varactor diode 128 is coupled to a second terminal of inductor 122, which is coupled to ground. Varactor diodes 126 and 128 and inductor 122 form a resonating LC circuit having a variable resonant frequency that is varied by varying the voltage applied to the cathodes of varactor diodes 126 and 128 via a resistor 130 coupled to a voltage control terminal 73".

RF circuit 58 further includes a variable gain amplifier (VGA) 74 having an input coupled to an output of VCO 73 applies signals to the input of a transmit amplifier 77 through a coupling circuit 76. An output capacitor 78 is coupled between an output of transmit amplifier 77 and the cathode of varactor diode 71.

RF circuit 58 additionally includes a capacitor 80 coupled to the cathode of varactor diode 71 for coupling a mixer 79 to antenna 59. A buffer amplifier 81 has an input coupled to an output of VCO 73 and applies signals therefrom to one input of mixer 79 having its remaining input terminal coupled to capacitor 80 for receiving signals from antenna 59. A bandpass filter 82 has an input coupled to receive signals from an output of mixer 79 and has an output coupled an input of an amplifier 83. Bandpass filter 82 preferably has a narrow bandwidth and a center frequency of 3 MHz to pass a data signal having a 3 MHz frequency component while blocking all other signals output from mixer 79.

The output of amplifier 83 is coupled to the input of an integrator 84 having an output coupled to a data input terminal of microcontroller 57. Integrator 84 integrates and rectifies the signal supplied from amplifier 83 to remove the 3 MHz frequency component from the signal and to provide a demodulated representation of the data code of the remote transmitter to microcontroller 57.

In addition, RF circuit 58 includes a serial port and control logic circuit 75 having inputs terminals coupled to a serial data address (SDA) line 75' and a serial control logic (SCL) line 75". VCO output 73' is also coupled to an input of buffer 91 having its output coupled to a feedback input of a phase-locked loop circuit 85. A reference oscillator including a crystal 86 having first and second terminals coupled across an amplifier 87 and to comparator amplifier 88. The reference oscillator 86 is thus coupled to a clock input of controller 57 and to phase-locked loop circuit 85 for supplying a reference signal to be compared with the signal output from VCO 73.

RF circuit 58 also includes a low pass filter 89 having an input terminal coupled to an output 85' of phase-locked loop circuit 85 for holding a control voltage that is applied to a voltage control terminal 73" of VCO 73 via a voltage control buffer 90.

VCO 73 outputs an RF signal having a frequency that may be adjusted by varying the voltage applied to its voltage control terminal 73". The RF signal output from VCO 73 is modulated with amplitude shift-keyed (ASK) data provided by microcontroller 57 when operating in a transmit mode. The modulated RF output signal of VCO 73 is applied to VGA 74. VGA 74 variably amplifies the modulated RF signal supplied from VCO 73 in proportion to a GAIN control signal provided by serial port and control logic circuit 75 in response to control signals sent by microcontroller 57 over the SCL line 75" and the SDA line 75'. VGA 74 may be implemented with a pair of differential amplifiers and a digitally controlled current diverter that diverts current from one of the differential amplifiers to the other differential amplifier thereby selectively decreasing the gain of VGA 74. As described in greater detail below, the gain level of VGA 74 is determined as a function of the duty cycle and frequency of the signal to be output from VCO 73.

The gain-adjusted output of VGA 74 is supplied to coupling circuit 76, which filters undesirable harmonics from the RF signal output from VGA 74. Preferably, coupling circuit 76 includes a 22 ohm resistor coupled in series with a 470 pF capacitor. The filtered output signal of coupling circuit 76 is then provided to transmit amplifier 77, which amplifies the filtered output to an appropriate transmission level. The output of transmission amplifier 77 is provided to antenna 59 via output capacitor 78, which preferably has a capacitance of 470 pF.

Previous systems have used a variable attenuator to reduce the power of the signal output from a relatively high power VCO. However, such systems tend to transmit undesirable harmonic components with the desired activation signal. It is desirable to remove these harmonic components from the RF signal output by VCO 73 because the output energy level of such harmonic components transmitted from antenna 59 must be considered in computing an allowable output energy level under FCC guidelines. In other words, the greater the amplitude of harmonic frequency components output from antenna 59, the lower the transmitted amplitude of the desired carrier frequency component may be. Thus, the use of VGA 74, coupling circuit 76, and transmit amplifier 77, which amplify and filter a low power RF signal output from VCO 73, offers a distinct advantage over a transmission circuit utilizing a variable attenuator for attenuating a relatively high power output RF signal from a VCO.

Mixer 79 mixes received RF signals from antenna 59 with a reference RF signal generated by VCO 73 and supplied to mixer 79 through buffer 81. The output of mixer 79 includes several signal components including one component representing the received RF signal but having a carrier frequency equal to the difference of the carrier frequency of the received RF signal and the frequency of the RF reference signal generated by VCO 73. The output signal of mixer 79 is applied to the input of bandpass filter 82, which preferably has a narrow bandwidth centered about a frequency of 3 MHz such that bandpass filter 82 outputs an encoded data signal only when the frequency of the RF reference signal generated by VCO 73 is 3 MHz above or below the carrier frequency of the received RF signal. Thus, the remaining signal components of the output of mixer 79 are blocked by bandpass filter 82. The encoded output data signal from bandpass filter 82 is amplified by amplifier 83 and integrated by integrator 84 to provide a signal having the same data code as that output from a remote transmitter 65 (FIG. 5). A suitable mixer, amplifier, and integrator for use in the present invention are disclosed in allowed U.S. Pat. No. 5,442,340 entitled "TRAINABLE RF TRANSMITTER INCLUDING ATTENUATION CONTROL," the disclosure of which is incorporated by reference herein.

The data signal output from integrator 84, which is typically amplitude shift-keyed (ASK) data, also has the same data format as the RF activation signal B transmitted by remote transmitter 65. The ASK data output from integrator 84 is provided to microcontroller 57 for further processing and storage. The manner in which microcontroller 57 processes and stores this ASK data and controls RF circuit 58 is described in greater detail below following a description of the portion of RF circuit 58 that provides a voltage control signal to VCO 73.

Figure 7:
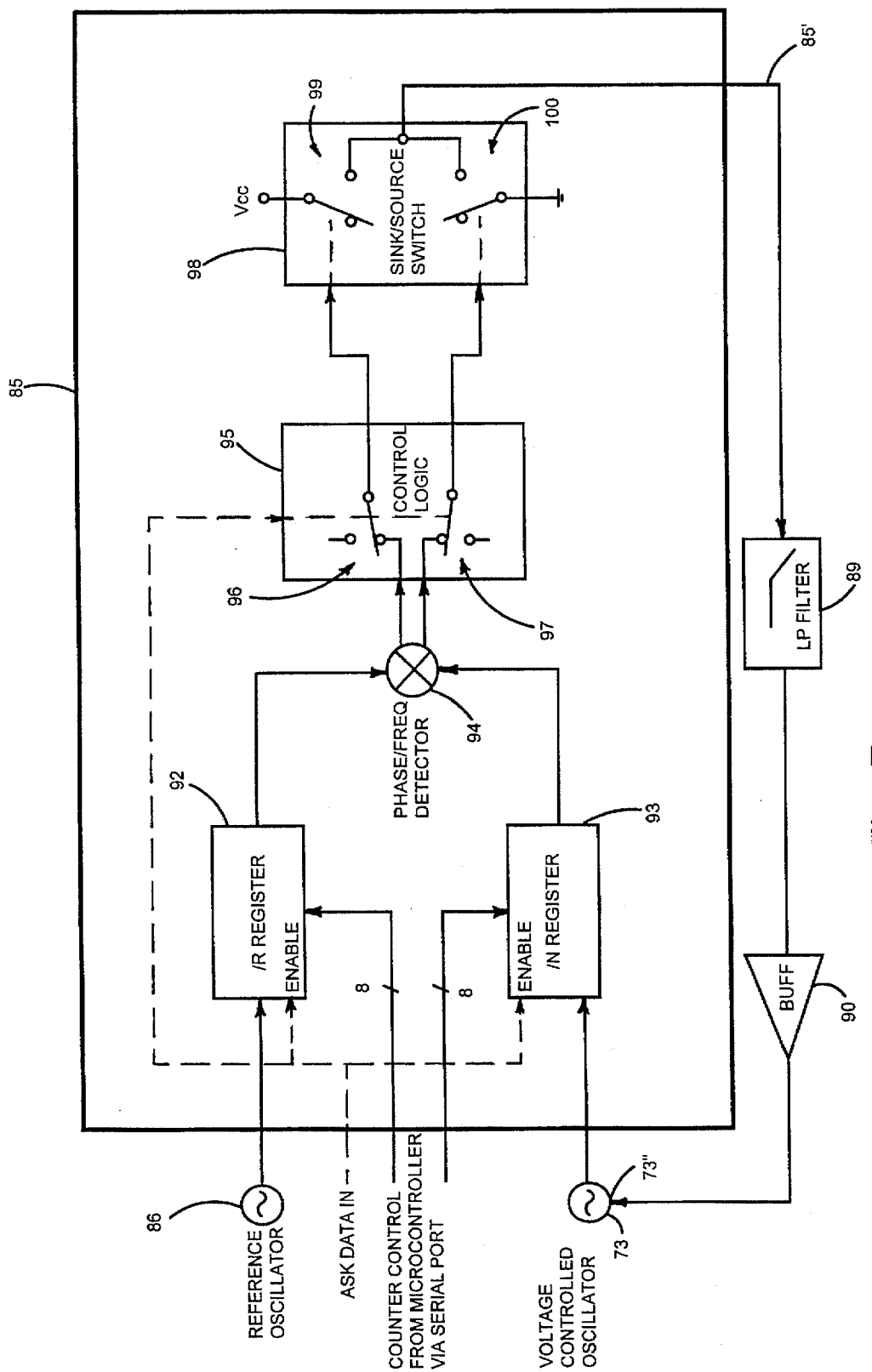
FIG. 7 is an electrical circuit diagram partly in block and schematic form showing the details of the phase-locked loop shown in FIG. 6A.

The portion of RF circuit 58 that supplies the voltage control signal to VCO 73 includes phase-locked loop circuit 85, reference oscillator 86, amplifier 87, comparator amplifier 88, low pass filter 89, voltage control buffer 90, and a VCO output buffer 91. The manner in which this portion of RF circuit 58 operates is described with reference to FIG. 7, which shows the detailed construction of the phase-locked loop circuit 85. Phase-locked loop circuit 85 includes a divide-by-R register 92 having an input coupled to the second terminal of reference oscillator 86. A divide-by-N register 93 has an input coupled to the output of VCO output buffer 91. The outputs of registers 92 and 93 are coupled to input terminals of a phase/frequency detector 94 having an output coupled to the input of a control logic circuit 95. Control logic circuit 95 in turn has a pair of terminals coupled to inputs of a sink/source switch circuit 98 having an output terminal coupled to the input of low pass filter 89. Preferably, low pass filter 89 includes a 560Ω resistor coupled to the output of phase-locked loop circuit 85, a 1.2 μF capacitor coupled in series with the 560Ω resistor, and a 0.1 μF capacitor connected in parallel with the 560Ω resistor and the 1.2 μF capacitor.

The primary purpose of phase-locked loop circuit 85 is to compare the frequency of the RF signal output by VCO 73 with that of reference oscillator 86 and to control the voltage applied to the voltage control terminal of VCO 73 such that the frequency of the RF signal output by VCO 73 has a predetermined relationship to the frequency of reference oscillator 86. The predetermined relationship between the frequencies of these respective signals is a ratio of two variables R and N supplied to divide-by-R register 92 and divide-by-N register 93, respectively, from microcontroller 57 via serial port and control logic circuit 75. Mathematically, the relationship between the frequency $f_{VCO}$ of the RF signal output by VCO 73 and the frequency $f_{REF}$ of the signal output by reference oscillator 86 may be expressed as follows:

$$f_{VCO} = \frac{N}{R} f_{REF}$$

where $f_{REF}$ is a constant value of, for example, 4 MHz. Thus, using $f_{REF}$=4 MHz and R=4, the frequency $f_{VCO}$ may be controlled to be equal to N MHz. If $f_{REF}$ and R constant are held constant, increasing the value N increases the frequency $f_{VCO}$ accordingly. If the value of R is increased, the frequency $f_{VCO}$ may be more finely controlled. On the other hand, the smaller the value of R, the greater the range in which $f_{VCO}$ may operate. Preferably, the values of R and N are provided as eight bits of data.

The outputs of divide-by-R register 92 and divide-by-N register 93 are supplied to phase/frequency detector 94, which compares the frequency of the signal output from divide-by-N register 93 with the frequency output from divide-by-R register 92 and provides output pulses corresponding to the difference in frequency. Phase/frequency detector 94 may be constructed in any conventional manner. If these respective frequencies are the same, phase/frequency detector 94 outputs pulsed control signals to switches 99 and 100 of sink/source switch circuit 98 such that both switches 99 and 100 remain open. When both of switches 99 and 100, which may be solid state switches such as CMOS or bipolar transistors, of sink/source switch circuit 98 are both held open, the voltage applied to the voltage control terminal of VCO 73 is held constant by buffer 90 and the voltage stored by the capacitors in low pass filter 89.

When the frequency of the signal output from divide-by-N register 93 is less than the frequency of the signal output from divide-by-R register 92, phase/frequency detector 94 supplies pulsed control signals to switches 99 and 100 causing switch 99 to close and switch 100 to remain open. When switch 99 is closed, a voltage $V_{CC}$ of five volts, for example, is applied to the capacitor of low pass filter 89 thereby increasing the voltage applied to the voltage control terminal of VCO 73. The increased voltage at the voltage control terminal of VCO 73 causes VCO 73 to increase the frequency of its output RF signal, which, in turn, increases the frequency of the signal output by divide-by-N register 93. When the frequencies of the signals output from divide-by-R register 92 and divide-by-N register 93 are the same, phase/frequency detector 94 provides control signals to switches 99 and 100 to open switch 99 and to maintain switch 100 in an open position.

If the frequency of the signal output from divide-by-N register 93 is greater than the frequency of the signal output from divide-by-R register 92, phase/frequency detector 94 outputs control signals to switches 99 and 100 causing switch 99 to remain open and switch 100 to close. When switch 100 is closed, the capacitor in low pass filter 89 is connected ground and, thus, discharges. The discharging of the capacitor in low pass filter 89 decreases the voltage applied to the voltage control terminal of VCO 73, which causes VCO 73 to reduce the frequency of the output RF signal. Thus, the frequency of the output signal from divide-by-N register 93 is decreased until phase/frequency detector 94 determines that the frequencies of the signals output from divide-by-R register 92 and divide-by-N register 93 are the same.

Control logic circuit 95 is provided to selectively connect and disconnect phase/frequency detector 94 from sink/source switch circuit 98 in accordance with the logic level of the ASK data read from the memory of microcontroller 57 during a transmit mode. During a transmit mode, microcontroller 57 enables and disables VCO 73 using the ASK data stored in its memory for the selected channel in order to modulate the ASK data onto the carrier RF signal generated by VCO 73 for transmitting the learned data code. When VCO 73 is disabled by the ASK data, the frequency of the signal output from VCO 73 as detected by phase-locked loop circuit 85 falls to zero. If appropriate means were not provided in phase-locked loop circuit 85, phase/frequency detector 94 would control sink/source switch circuit 98 such that the frequency control voltage applied to VCO 73 is significantly increased when VCO 73 is disabled. Then, upon being enabled, VCO 73 would initially begin transmission at a carrier frequency far exceeding that which is desired. In order to prevent phase-locked loop circuit 85 from dramatically increasing the frequency of VCO 73 during a disabled state, control logic circuit 95 is provided to selectively disconnect phase/frequency detector 94 from sink/source switch circuit 98 when the ASK data is at a level which disables VCO 73.

In order to maintain the phase relationship between the signals output from divide-by-R register 92 and divide-by-N register 93 following a disablement of VCO 73, the ASK data read from the memory of microcontroller 57 during a transmit mode is provided to enable and disable divide-by-R register 92 and divide-by-N register 93 in synchronism with VCO 73, which is also enabled and disabled by the ASK data signal.

To prevent transmission of signals during a learning mode, serial port and control logic circuit 75 (FIG. 6A) controls the enablement and disablement of VGA 74 and transmit amplifier 77 by applying a transmit control signal TX. Similarly, serial port and control logic circuit 75 provides a receive control signal RX, which is applied to selectively enable and disable mixer 79, receive buffer 81, amplifier 83, and integrator 84 as shown by the dashed line enable inputs of FIG. 6A.

RF circuit 58 is preferably incorporated into an application-specific integrated circuit (ASIC) 101 manufactured employing existing integrated circuit technology. In the preferred embodiment shown in FIG. 6A, the following elements are provided on a substrate 102 of ASIC 101: VGA 74; transmit amplifier 77; mixer 79; receive buffer 81; amplifier 83; integrator 84; phase-locked loop circuit 85; amplifier 87; comparator 88; voltage control buffer 90; and the oscillator portion 103 of VCO 73. Although coupling circuit 75, output capacitor 78, input capacitor 80, bandpass filter 82, reference oscillator 86, low pass filter 89, and the LC resonator portion 104 of VCO 73 are not shown as being incorporated into ASIC 101 to avoid including relatively large capacitors within substrate 102, these elements could nevertheless be included in ASIC 101.

Having described the electrical circuit elements of transceiver circuit 55, the manner by which microcontroller 57 controls transceiver circuit 55 is now discussed with reference to FIGS. 8, 9A–9G, 10, 11A–11B, and 12. In FIGS. 9A–9G, the transfer ports of the flow diagram are referenced by a letter optionally followed by a number. The reference letter refers to the letter portion of the drawing figure number following FIG. 9. For example, the transfer port labelled C illustrates a transfer in the process to a transfer entry port labelled C in FIG. 9C. The optional number following the reference letter represents one of a plurality of entry points into the process illustrated in the drawing figure corresponding to the reference letter. For example, the transfer port labelled E1 illustrates a transfer to the process shown in FIG. 9E at the transfer entry port labelled E1.

As indicated in the test of block 200 (FIG. 8), operation begins when one of pushbutton switches 44, 46, and 47 is actuated. Upon detecting that one of switches 44, 46, and 47 has been depressed, microcontroller 57 receives a signal through interface 49 (FIG. 5) and initializes its ports and its random access memory (RAM) as indicated in block 202. Next, the program begins a twenty second timer (block 204) and reads the channel corresponding with the switch 44, 46, and 47 that has been depressed (block 206). Next, the program for microcontroller 57 determines whether the selected channel has been trained (block 208). If the selected channel has previously been trained, microcontroller 57 downloads the data associated with the selected channel into its RAM (block 210), sets the gain of VGA 74 and the frequency to be output by VCO 73, and tunes antenna 59 in accordance with the data associated with the selected channel (block 212). Microcontroller 57 sets the frequency of VCO 73 by providing the appropriate output signals representing values of R and N to divide-by-R register 92 and divide-by-N register 93 via serial port and control logic circuit 75.

Microcontroller 57 sets the gain of VGA 74 by providing a control signal to serial port and control logic circuit 75 over the SCL and SDA lines. The GAIN control signal provided to a gain control input of VGA 74 may consist of a five-bit value, thus providing thirty-two possible gain levels. Because the FCC mandates allow different power levels based upon the duty cycle of the transmitted signal, it is advantageous for the trainable transceiver to be capable of dynamically adjusting the gain of the transmitted signal. Therefore, by providing a number of possible gain levels, transceiver 43 can transmit at the maximum allowable power level for each different frequency and encoded signal it may transmit.

To optimize the appropriate gain level for a given transmitted activation signal, microcontroller 57 first looks at the frequency of the signal to be transmitted to determine its relative power. Assuming that each of the thirty-two possible gain levels correspond to a different integer between 0 and 32 with 0 representing the maximum gain adjustment and 32 representing the minimum gain adjustment, microcontroller 57 selects an initial gain level based upon the frequency of the signal to be transmitted. For example, microcontroller 57 may select an initial gain level of 5 for a strong powered signal and select an initial gain level of 0 for a relatively weak powered signal. Then, microcontroller 57 determines the duty cycle of the code by taking a predetermined number of total samples of the code within a predetermined period of time, counting the number of samples of the code having a high logic level, multiplying the counted number of samples having a high logic level by a predefined constant to determine a product, and dividing the product by the predetermined number of total samples. Microcontroller 57 adjusts the selected initial gain level based upon the duty cycle. For example, if the initial gain level is 5, microcontroller 57 adjusts the gain level to a level falling between 5 and 32 where the lowest gain level (32) corresponds to the highest duty cycle and the highest gain level (5) not exceeding the initial gain level corresponds to the lowest duty cycle. Microcontroller 57 may also select a gain level based upon a determination of whether the data code is fast or slow. An example of how a duty cycle of a code signal may be determined and an output power level may be selected based upon the duty cycle and frequency of the signal to be transmitted is disclosed in U.S. Pat. No. 5,442,340, the disclosure of which is herein incorporated by reference. The manner by which microcontroller 57 determines that the data code provided in the received activation signal is fast or slow is described below.

The gain of VGA 74 preferably may be varied between 15 and 20 dB, and transmit amplifier 77 preferably has a gain of 25 dB. Together, VGA 74 and transmit amplifier 77 provide a variable gain of 10 dB. Preferably, the output power of transceiver 43 is between 0 and 5 dBm.

Microcontroller 57 tunes antenna 59 by providing antenna control data to D/A converter 72. The antenna control data preferably has an eight-bit value, which may be computed from the frequency of VCO 73 or read from a table including a list eight-bit values associated with various frequencies that may be output from VCO 73. In general, the voltage output from D/A converter 72 is controlled to vary from 0.5 to 4.5 V linearly with respect to a 220 to 440 MHz frequency range. Thus, each increment in the eight-bit value provided by microcontroller 57 represents about a 15.6 mV increment in the output voltage of D/A converter 72. The eight-bit antenna control data may be previously stored in association with the selected channel or may be computed from the frequency data after the data is read from memory. The capacitance of varactor diode 71 varies linearly and inversely to the voltage applied to its cathode. For example, varactor diode 71 may have a capacitance of 14 pF when the applied voltage is 0.5 V and a capacitance of 2.4 pF when the applied voltage is 4.5 V. In this manner, small loop antenna 70, which has a relatively small bandwidth for receiving and transmitting signals, may be tuned to have a resonance frequency matching the carrier frequency of a transmitted or received signal such that it more efficiently receives an RF activation signal from a remote transmitter and radiates the RF transmit signal provided from transmit amplifier 76. By providing the capability of dynamically tuning antenna 59 and varying the gain of the output signal as applied to the cathode of varactor diode 71 through output capacitor 78, trainable transceiver circuit 55 maintains a matched impedance of antenna 59 and the output impedance of RF circuit 58.

After setting the gain of VGA 74, the frequency of VCO 73, and the tuning of antenna 59 as indicated in block 212 (FIG. 8), the microcontroller 57 reads the data code stored in memory in association with the selected channel and provides this ASK data to VCO 73 and phase-locked loop circuit 85 to modulate the RF signal generated by VCO 73 by disabling and enabling VCO 73 with the ASK data. Additionally, microcontroller 57 instructs serial port and control logic circuit 75 to output a transmit signal TX to VGA 74 and transmit amplifier 77 to enable the transmission of the modulated RF output signal of VCO 73 as indicated by block 214.

Figure 9A:
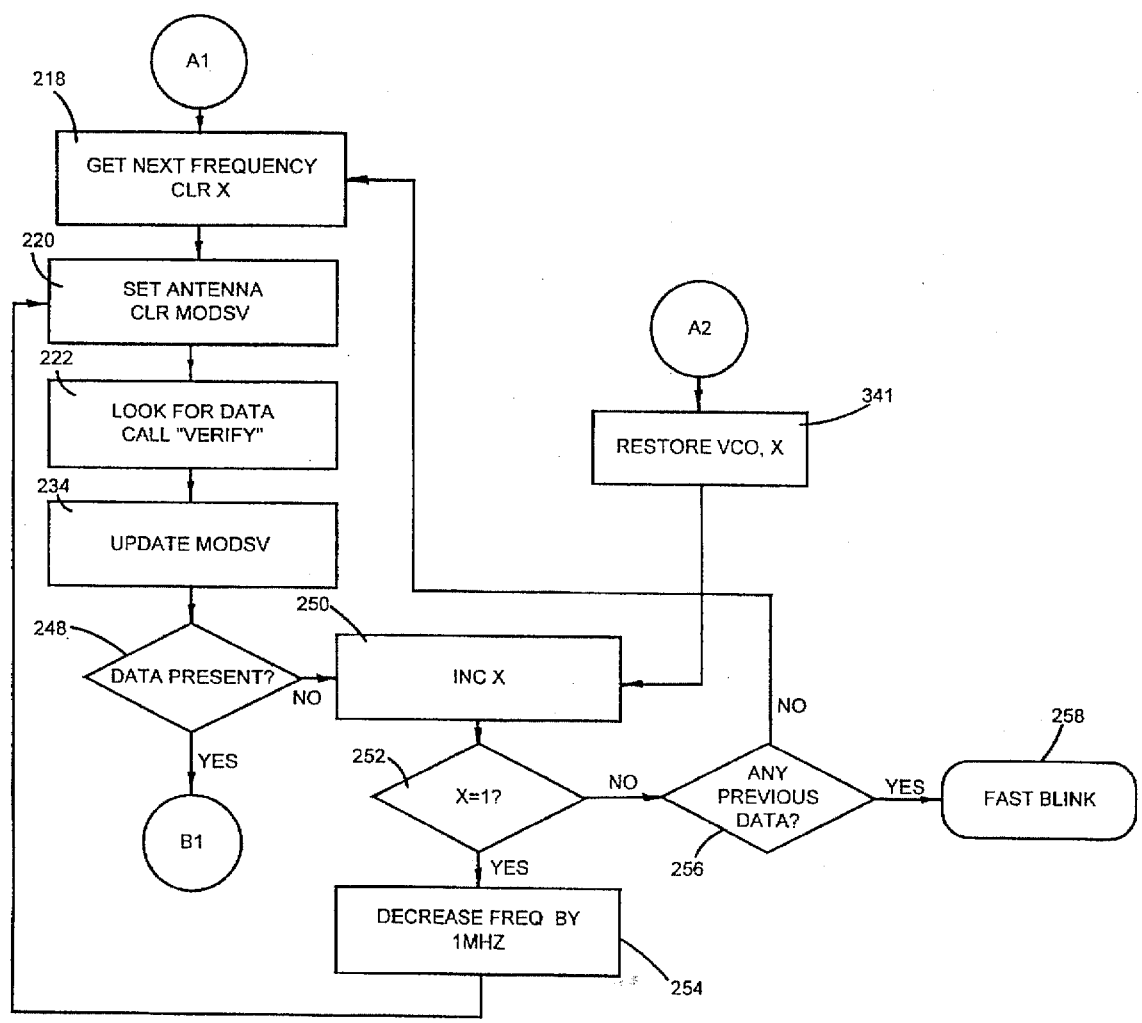
FIGS. 9A–9G is a flow diagram of the training sequence performed by the microcontroller shown in FIGS. 5 and 6A.

While performing the above steps, microcontroller 57 monitors the twenty second timer to determine whether the pushbutton switch that was depressed has been continuously depressed for a twenty second interval (block 216). If the twenty second interval has not expired, microcontroller 57 continues to transmit the RF signal associated with the selected channel (block 214). If microcontroller 57 determines in block 216 that the switch that was depressed has been continuously depressed for the twenty second interval, or if microcontroller 57 determines in block 208 that the channel associated with the depressed switch has not been trained, microcontroller 57 begins a training sequence that begins in block 218 (FIG. 9A). Before describing the detailed procedure performed by microcontroller 57 in the training mode, a general overview is provided below.

During a training sequence, microcontroller 57 provides frequency control data representing the values R and N for an initial frequency to phase-locked loop circuit 85 (FIG. 6A), and looks for the presence of received data on an RF transmitted signal B (FIG. 5) which is received by antenna 59, processed through mixer 79, bandpass filter 82, and amplifier 83 and applied to microcontroller 57 from integrator 84. Upon receiving the frequency control data, phase-locked loop circuit 85 provides a frequency control voltage to a frequency control terminal of VCO 73. VCO 73 generates a reference signal having a reference frequency corresponding to the frequency control voltage and provides the reference signal to mixer 79. If the reference frequency has a predetermined relationship to the carrier frequency of the received RF activation signal B, integrator 84 provides the code signal of the received activation signal to microcontroller 57. In the preferred embodiment, the predetermined relationship will exist when the difference between the reference frequency and the carrier frequency of the received activation signal is 3 MHz.

If microcontroller 57 does not receive a code signal from integrator 84 for the initial frequency, microcontroller 57 in the next loop selects another frequency and provides phase-locked loop circuit with frequency control data corresponding to the new frequency. Microcontroller 57 continues to select new frequencies in this manner until a code signal is detected as indicated by a signal from integrator 84. Microcontroller 57 affirms the presence of a code signal using a verification routine, which counts the number of rising edges appearing in any signal received from integrator 84 during a predetermined time interval and determines that data is present when the counted number of rising edges exceeds a threshold level. The verification subroutine is described in greater detail below.

Upon detecting a code signal, which preferably occurs when the reference frequency is 3 MHz below the carrier frequency of the received activation signal, microcontroller 57 stores the frequency control data corresponding to the carrier frequency of the received activation signal, and increases the reference frequency by 3 MHz. Ideally, the code signal should disappear at this frequency, however, if the code signal does not disappear at this frequency, microcontroller 57 attempts to encode the code signal it is still receiving at this frequency in order to determine whether the code signal is merely noise attributable to the code signal detected at the frequency 3 MHz lower or whether the code signal detected at this frequency more than mere noise.

By attempting to encode the code signal, microcontroller 57 can perform a more rigorous test on the code signal to determine whether the code signal is legitimate. As will be described in greater detail below, microcontroller 57 attempts to encode the code signal using an ENCODE subroutine, which further analyzes the code signal to identify its modulation scheme and stores the code signal in memory using the most appropriate encoding technique for the identified modulation scheme of the code signal. If the Encode subroutine can identify the modulation scheme of the code signal and store the code signal, the attempt to encode the code signal is deemed successful.

If the code signal received at this increased frequency, which corresponds to the frequency of the received activation signal, is successfully encoded, microcontroller 57 determines that the code signal received at both the initial frequency and the increased frequency is not legitimate because, based on empirical data, a legitimate code signal should not be encodable at two frequencies 3 MHz apart. Having determined that the code signal at this frequency is not legitimate, the program executed by microcontroller 57 selects a new frequency and repeats the above process until a legitimate code signal is detected.

If a code signal is not detected or if a non-encodable code signal is detected at the frequency 3 MHz above the frequency at which the code signal was first detected, microcontroller 57 increases the frequency another 3 MHz and looks for a code signal. Ideally the code signal that disappeared at the previous frequency will reappear at this increased frequency since it is 3 MHz different than the transmitter frequency B and the frequency difference component output from mixer 79 passes through bandpass filter 82. If the code signal reappears, microcontroller 57 changes the reference frequency to the frequency at which the code signal was first detected (i.e., at 3 MHz below the frequency of the activation signal B), and encodes and stores the code signal. In general, microcontroller 57 stores the code signal by sampling the signal at a relatively high sampling rate such as one sample per 68 microseconds. Different sampling rates may be selected for different code signals based upon detected characteristics to the code format of the received code signal. In this manner, microcontroller 57 may reproduce the code signal during a transmit mode, by reading the stored code signal from memory using the same sampling rate at which it stored the code signal. Alternatively, the data representing the number of consecutive samples of the code signal at high and low logic states may be stored or data representing the number of periods at a particular data frequency may be stored.

To double check that the received code signal is legitimate, microcontroller 57 preferably sets a DATPREV flag, returns to the beginning of the training sequence, selects a new, higher frequency, and confirms that the previously detected code signal is legitimate provided a code signal is not detected at this new frequency. Having provided a general overview of the training sequence, a more detailed description is provided below with reference to FIGS. 9A–9G, 10, 11A, 11B, and 12.

Microcontroller 57 begins the training sequence in block 218 of the program (FIG. 9A) by retrieving R and N frequency control data representing a frequency 3 MHz below a first frequency provided in a prestored frequency table and by clearing an X register. Preferably, the frequency table first includes, in increasing value, the known operating frequencies of garage door transmitters that transmit only for a limited duration (i.e., approximately two seconds), such as the older Canadian garage door transmitters. These short duration transmitter frequencies are followed in the frequency table by the frequencies at which other commercially available garage door transmitters are known to operate. The frequencies associated with short duration transmitters are provided first in the frequency table in order to increase the likelihood that a successful train will occur before such a short duration transmitter stops transmitting its RF activation signal. In the event that the RF activation signal transmitted by a garage door transmitter does not have a frequency stored in the frequency table, trainable transceiver 43 will increment an initial frequency at 1 MHz intervals until the frequency of the received RF activation signal is identified.

After retrieving the first or next available frequency in the frequency table, microcontroller 57 tunes antenna 59 to a resonance frequency matching the retrieved frequency (block 220). Additionally, microcontroller 57 clears a mode save (MODSV) register. Next, microcontroller 57 sets the frequency of the signal generated by VCO 73 to a reference frequency 3 MHz below the retrieved frequency by providing the appropriate R and N values to divide-by-R register 92 and divide-by-N register 93 and instructs serial port and control logic circuit 75 to output a receive signal RX to enable receive buffer 81, mixer 79, receive amplifier 83, and integrator 84.

Next, microcontroller 57 outputs a signal to cause LED 48 to blink in order to inform the person who depressed one of switches 44, 46, and 47 that they should activate the remote garage door transmitter 65 to which trainable transceiver 43 is to be trained. Subsequently, antenna 59 receives the RF activation signal transmitted by remote transmitter 65 and provides the received signal to mixer 79 where the received RF activation signal is mixed with the signal output from VCO 73. If the frequency of the signal output by VCO 73 is 3 MHz above or below the frequency of the received RF activation signal, microcontroller 57 will detect any ASK data contained in the received RF activation signal and will call a "VERIFY" subroutine to verify the presence of a valid data code signal (block 222) and identify the data code as "fast" or "slow" data.

Fast data is detected when the data has more than five rising edges in a 850 μsec interval. Slow data is detected when the data has five or less rising edges in a 850 μsec interval, but more than five rising edges detected in a 70 msec interval. Fast data includes two general types of data—GENIE data, which is transmitted from GENIE brand transmitters, and non-GENIE (single tone) data. The distinction between GENIE and non-GENIE data is made in an ENCODE subroutine described below. GENIE data differs from the data transmitted by other brands of remote garage door transmitters in that the GENIE data is frequency shift-keyed data having pulse repetition rates that shift between 10 and 20 kHz. GENIE data is typically transmitted at a carrier frequency that falls between 290 and 320 MHz at 5 MHz intervals. As will be apparent from the description below, the classification of the data as either fast, slow, GENIE, or single tone affects the manner by which microcontroller 57 subsequently checks, stores, and encodes the data.

Figure 10:
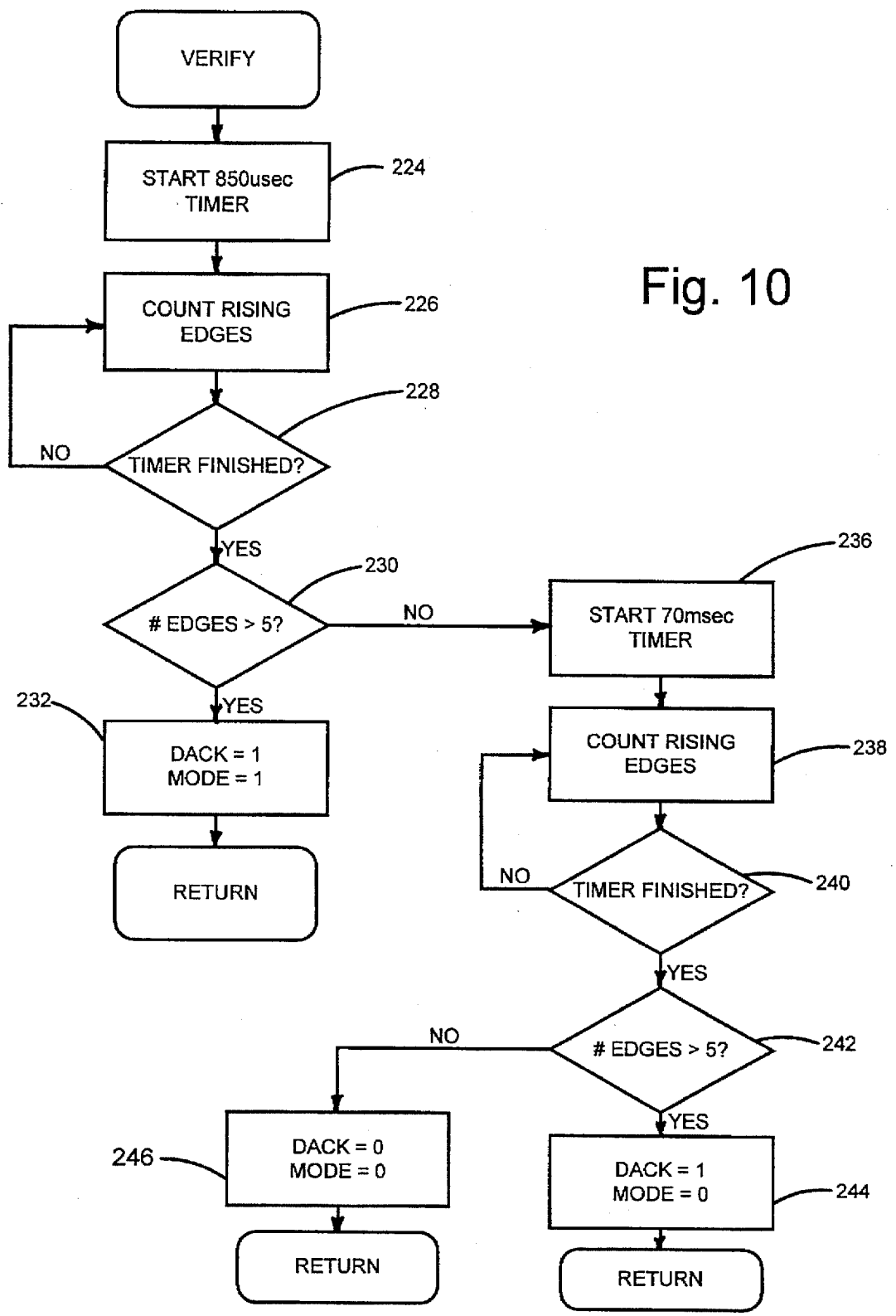
FIG. 10 is a flow diagram of a data verification subroutine utilized during the training programming performed by the microcontroller shown in FIGS. 5 and 6A.

The VERIFY subroutine is shown in FIG. 10 and begins at block 224 at which point microcontroller 57 begins a 850 microsecond timer. In blocks 226 and 228, microcontroller 57 counts the number of rising edges in the ASK data within the 850 μsec interval measured by the timer. In block 230, microcontroller 57 determines whether the number of detected rising edges is greater than five. If the number of rising edges is greater than five, microcontroller 57 sets a data acknowledge (DACK) flag to "1" indicating that data has been verified and sets a mode bit to "1" indicating that the data is fast (block 232) and returns to block 234 (FIG. 9A) where microcontroller 57 updates the MODSV register to store the value of the mode bit.

If the microcontroller program determines in block 230 that the number of detected rising edges is not greater than five, the program advances to block 236 where it begins a 70 msec timer. In blocks 238 and 240, the program counts the number of rising edges detected during the 70 msec interval. If the number of rising edges is greater than five (block 242), the program sets the DACK flag to "1" and the mode bit to "0" (block 244) indicating that the data is slow and returns to the block following that block which last called the VERIFY subroutine. If microcontroller 57 determines that the number of rising edges detected during the 70 msec interval is not greater than five, the program sets the DACK flag to "0" indicating the absence of verified ASK data, sets the mode bit to "0", and returns to the block following that block which last called the VERIFY subroutine, as indicated in block 246.

Referring back to FIG. 9A, after returning from the VERIFY subroutine and updating the MODSV register, the program looks at the DACK flag to determine whether verified ASK data is present (block 248). If data is not present, the program advances to block 250 where the X counter is incremented. Then, the program determines whether the X counter is equal to 1 (block 252). Upon determining that X is equal to 1, microcontroller 57 decreases the frequency of VCO 73 by 1 MHz (block 254) and then repeats the steps set forth in blocks 220–234. Then in block 248, microcontroller 57 again determines whether data was detected as being present. By looking for data at a frequency 4 MHz below a frequency stored in the frequency table, microcontroller 57 can check whether the received activation signal is transmitted at a slightly lower frequency than expected due to production variances that may be present in the remote transmitter.

If data is again not present, the program increases the X counter (block 250) and checks whether the value of X is equal to 1 (block 252). If X is not equal to 1, the program advances to block 256 where it determines whether any data had been previously detected by looking at a DATPREV flag. As discussed below, the DATPREV flag is set only after the received code signal has been rigorously tested. If data had been previously detected, microcontroller 57 causes LED 48 to rapidly blink (block 258) indicating a successful training sequence. On the other hand, if the microcontroller program determines that data had not been previously detected, it returns to block 218 to retrieve the next frequency in the frequency table and to clear the X register.

Microcontroller 57 repeats the sequence of steps set forth above and identified in blocks 218–256 until microcontroller 57 detects the presence of data in block 248. When data is present, the program advances to block 260 (FIG. 9B) where it saves the value of X, which will have a value of "0" if data was detected when the frequency of VCO 73 was 3 MHz below the last frequency retrieved from the frequency table, or a value of "1" if the frequency of VCO 73 is 4 MHz below the last retrieved frequency from the frequency table. Next, the microcontroller program adds the intermediate frequency (IF) of bandpass filter 82, which is preferably 3 MHz, to the frequency of the signal previously output from VCO 73. Additionally, microcontroller 57 tunes the antenna to an appropriate frequency for this increased VCO frequency (block 262).

Next, in block 264, the program checks to determine whether data is present by calling the VERIFY subroutine. If the frequency of VCO 73 was 3 MHz below the frequency of the received RF activation signal when microcontroller 57 verified the presence of data in block 248 (FIG. 9A), the detected data will typically disappear when a frequency of VCO 73 is increased by 3 MHz to be the same frequency as the RF activation signal. If, however, microcontroller 57 determines in block 266 that data is present when the frequency of VCO 73 is increased by 3 MHz, the microcontroller program checks the value of X in block 268 to determine whether the frequency of VCO 73 was previously set to 4 MHz below the frequency that was last retrieved from the frequency table. If the VCO frequency is 4 MHz below the last retrieved frequency from the frequency table, microcontroller 57 increments the VCO frequency by 1 MHz, retunes antenna 59 (block 270), and again attempts to verify the presence of data by returning to block 264. If data is again detected, the program advances to block 272 where the mode bit of the original data that was verified is restored to its initial value, which was stored in the MODSV register. Then, the microcontroller program puts the detected data through a more rigorous test by calling an "ENCODE" subroutine in block 274.

Figure 11A:
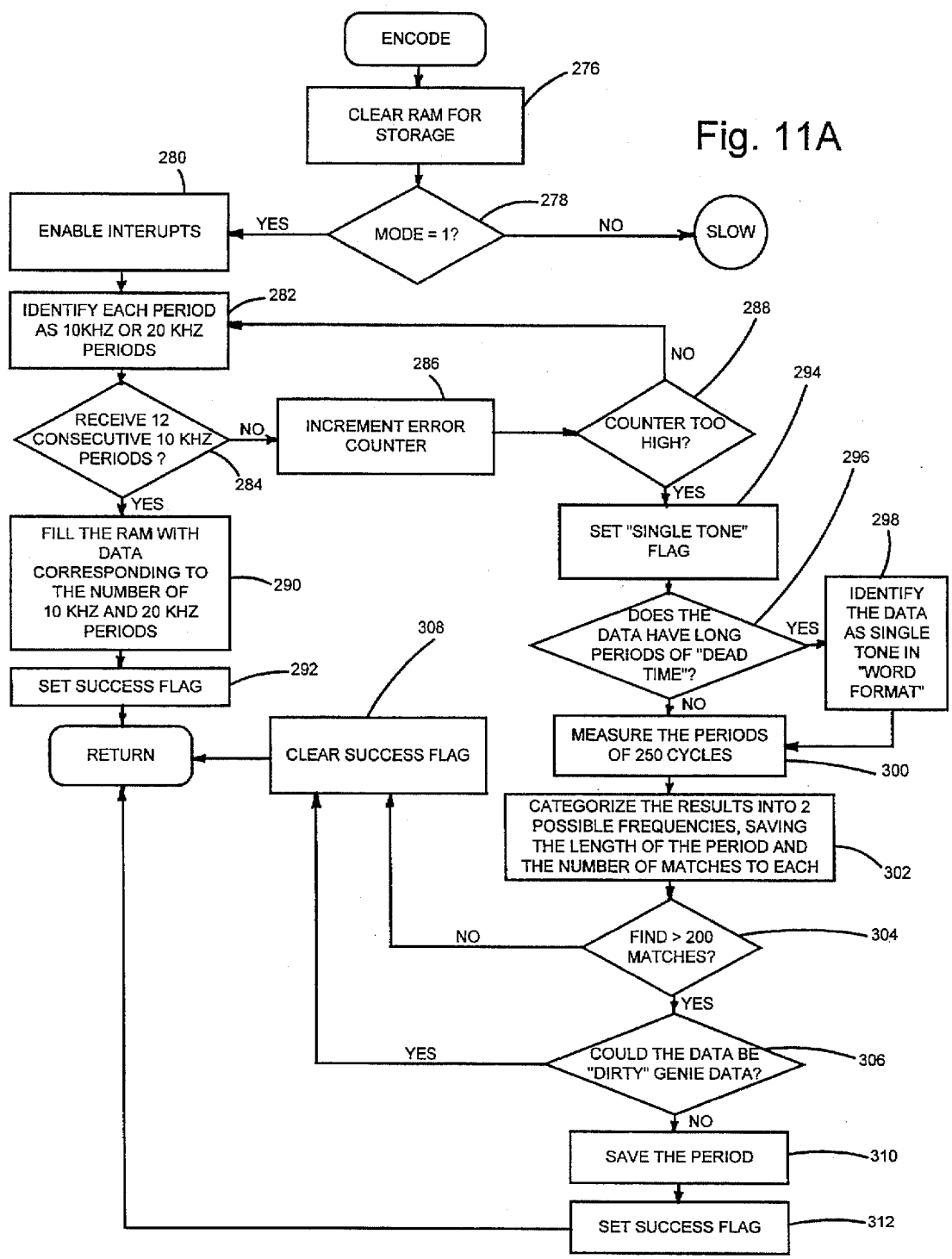
FIGS. 11A–11B is a flow diagram of an encoding subroutine utilized by the training programming performed by the microcontroller shown in FIGS. 5 and 6A.
Figure 11B:
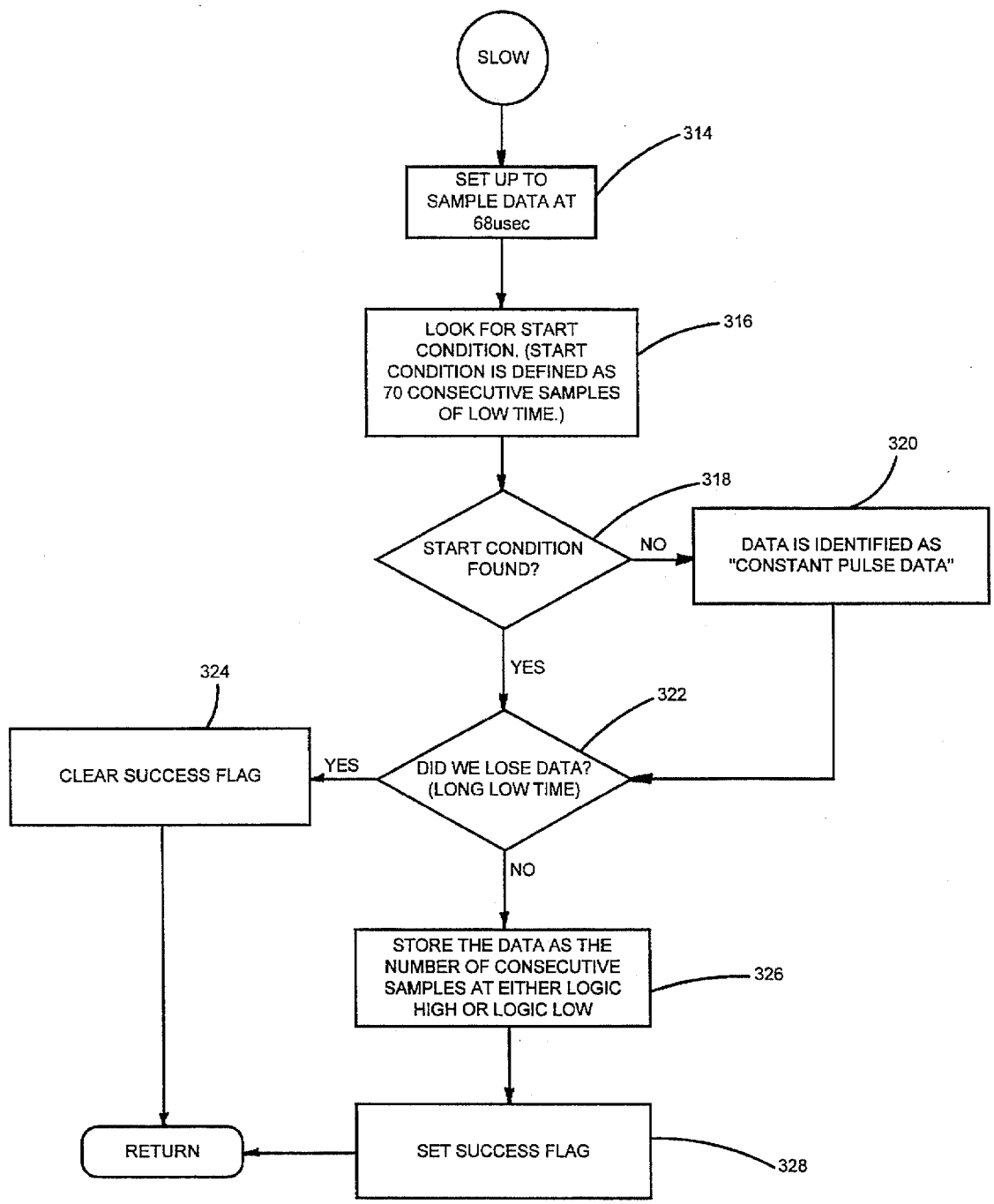

In the ENCODE subroutine shown in FIGS. 11A and 11B, microcontroller 57 first clears its RAM in block 276 and determines whether the mode bit is equal to 1 in block 278. If the mode bit is equal to 1, microcontroller 57 enables interrupts (block 280) such that it may identify each period in the data string as either 10 kHz or 20 kHz (block 282). Next, microcontroller 57 determines whether it has received twelve consecutive 10 kHz periods (block 284) in order to determine whether the data is frequency-shift keyed corresponding to an activation signal transmitted by a GENIE brand transmitter. If twelve consecutive 10 kHz periods have not been received, the program increments an error counter (block 286), and checks whether the error counter has reached too high a value (block 288). Provided that the error counter has not reached too high a value, microcontroller 57 continues to identify each period as either 10 kHz or 20 kHz (block 282) and to determine whether twelve consecutive 10 kHz periods have been received (block 284).

If microcontroller 57 receives twelve consecutive 10 kHz periods and fills the RAM with the received data corresponding to the number of 10 kHz and 20 kHz periods (block 290), the program sets the success flag (block 292) and returns to the block following that in which the ENCODE subroutine was last called.

If, however, in block 288, the program 57 determines that the error counter has reached too high a value, it determines that the received data is "single tone" data and sets a flag indicating that the data is single tone (block 294). In block 296, microcontroller 57 then determines whether the data has long periods of dead time. If the data has long periods of dead time, microcontroller 57 identifies the data as single tone data in word format, sets a word format flag, and measures and stores the length of the dead time (block 298). After determining that the data does not have long periods of dead time, or after identifying the data as single tone data in word format, microcontroller 57 stores the data string in the RAM and measures the periods of 250 cycles of the received data in block 300. Next, microcontroller 57 categorizes the results into two possible frequencies, saving the length of the period and the number of matches to each (block 302). If microcontroller 57 determines in block 304 that more than two hundred matches have been found for one of the two frequencies, it then determines in block 306 whether the data could be considered "dirty" GENIE data by determining whether either one of the two frequencies used to categorize the cycles are at or near 10 or 20 kHz. If the data could be dirty GENIE data, or if more than two hundred matches are not found in block 304, the microcontroller program clears the success flag in block 308 and returns to the block following that block in which the ENCODE subroutine was last called.

If, in block 306, microcontroller 57 determines that the data could not be dirty GENIE data, microcontroller 57 saves the period at which more than 200 matches were found (block 310), sets the success flag (block 312), and the program returns to the block following that block in which the ENCODE subroutine was last called.

If, in block 278 of the ENCODE subroutine of FIG. 11A, microcontroller 57 determines that the mode bit is not equal to one indicating that the received data is slow, microcontroller 57 sets up to sample the received data at 68 μsec in block 314 (FIG. 11B). Then, in block 316, microcontroller 57 looks for a start condition in the received data which is present when seventy consecutive samples are found at a low logic level. If the start condition is not found (block 318), microcontroller 57 identifies the data as "constant pulse data" in block 320. After the data is identified as "constant pulse data" or after a start condition is detected in block 318, microcontroller 57 then determines whether the data was lost in block 322 by determining whether the number of consecutive samples at a low logic level exceed a predetermined number. If microcontroller 57 determines that the data was lost in block 322, it clears the success flag in block 324 and the program returns to the block following that block which called the ENCODE subroutine. On the other hand, if microcontroller 57 determines that the data was not lost, it stores the data as the number of consecutive samples at either a high or low logic level (block 326), sets the success flag (block 328), and the program returns to the block following that block which called the ENCODE subroutine.

Returning to FIG. 9B, if the data that was verified at the last retrieved frequency in the frequency table and also at a frequency 3 MHz below the last retrieved frequency is successfully encoded (block 330), the microcontroller program checks the X value to determine whether the frequency of the VCO 73 was last set to a value 4 MHz below the last retrieved frequency from the frequency table (block 332). If the VCO was previously set at a frequency 4 MHz below the last retrieved frequency, microcontroller 57 increments the VCO frequency by 1 MHz, retunes antenna 59 (block 334), and the program returns to block 274 to try to encode the data. If this data is then successfully encoded, the program advances to block 336 where a noise counter NOISCNT is incremented.

Next in block 338, microcontroller 57 checks the value of NOISCNT to determine whether this value is too high indicating that trainable transceiver 43 is receiving noise at those frequencies at which data was verified. If the NOISCNT value is too high, microcontroller 57 determines whether the frequency last retrieved from the frequency table was a Canadian frequency (i.e., a frequency associated with an activation signal of short duration) (block 340).

Figure 9B:
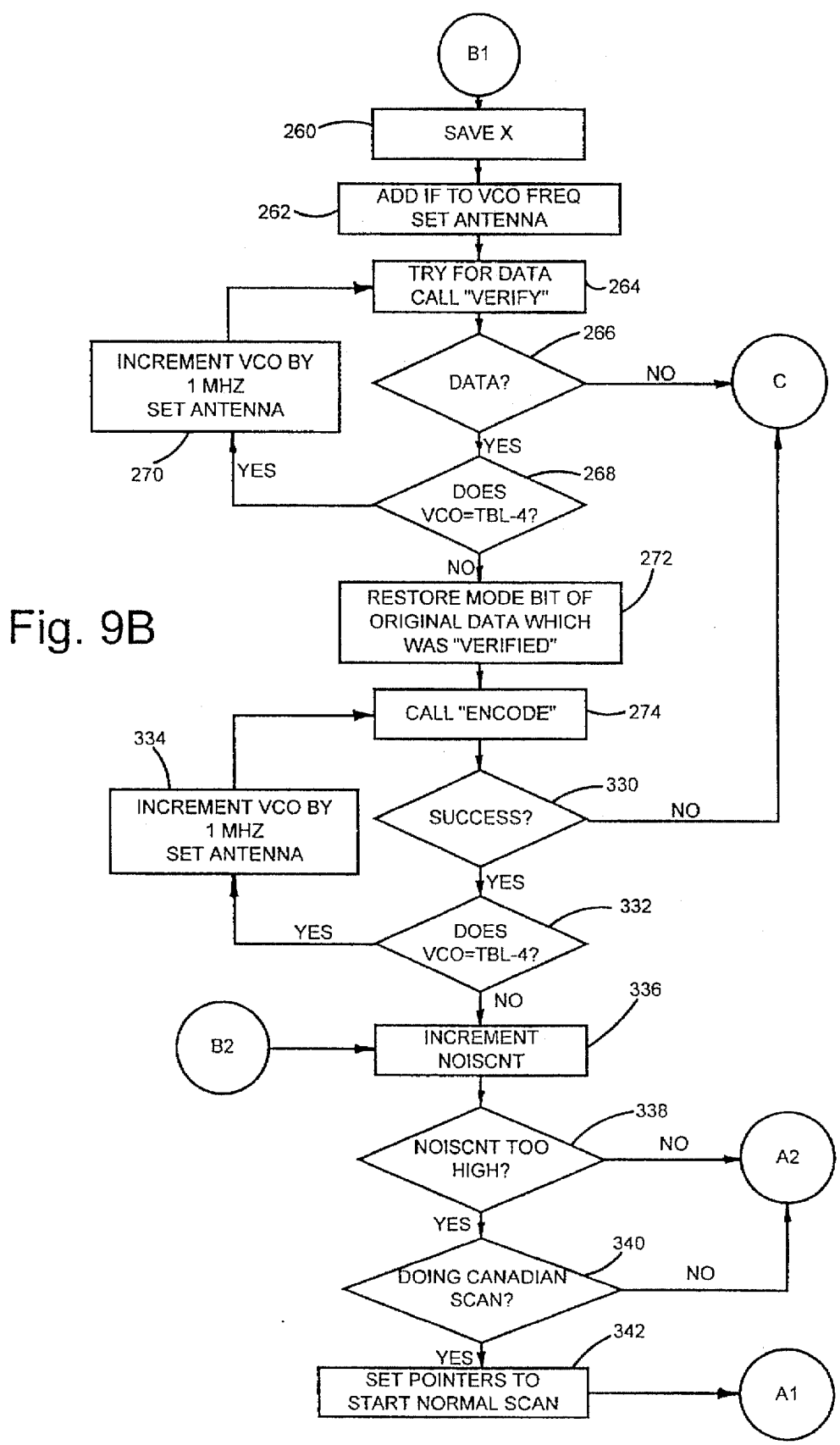

If the value of NOISCNT is not too high (block 338), or if the value of NOISCNT is too high and the frequency last retrieved from the frequency table is not a Canadian frequency, the program goes to block 341 (FIG. 9A) where it restores the frequency of VCO 73 and the value of X to the values they had prior to transferring to block 260 in FIG. 9B. Then the program increments the value of X m block 250 and determines in block 252 whether the value of X is equal to 1. If the value of X is not equal to 1, the program advances to block 256 where it determines whether data was previously detected. If data was previously detected, microcontroller 57 then outputs a signal to cause LED 48 to rapidly blink, thereby indicating a successful train (block 258). If, however, X is equal to 1 (block 252), microcontroller 57 decreases the frequency of the VCO by 1 MHz (block 254), and looks for data at that frequency by repeating the steps set forth in blocks 220–248.

Referring back to FIG. 9B, if the program determines in blocks 338 and 340 that NOISCNT is too high and the frequency last retrieved from the frequency table is a Canadian frequency, the program sets the pointers in the frequency table to point to the first frequency following the Canadian frequencies (block 342) and advances to block 218 (FIG. 9A) in order to attempt to detect data at the remaining frequencies stored in the frequency table.

As stated above, when a valid data code is present when the frequency of VCO 73 is set 3 MHz below the frequency of the RF activation signal, the data should disappear when the frequency of VCO 73 is increased by 3 MHz to coincide with the frequency of the received RF activation signal. Moreover, if the data, which is detected when the frequency of VCO 73 is increased to be the same as the frequency of the received RF activation signal, cannot be successfully encoded (block 330) a valid data code may be present. Thus, if data was not detected in block 266, or if detected data was not successfully encoded in block 330, the program advances to block 344 (FIG. 9C) where it adds the intermediate frequency of 3 MHz to the VCO frequency and retunes antenna 59.

Figure 9C:
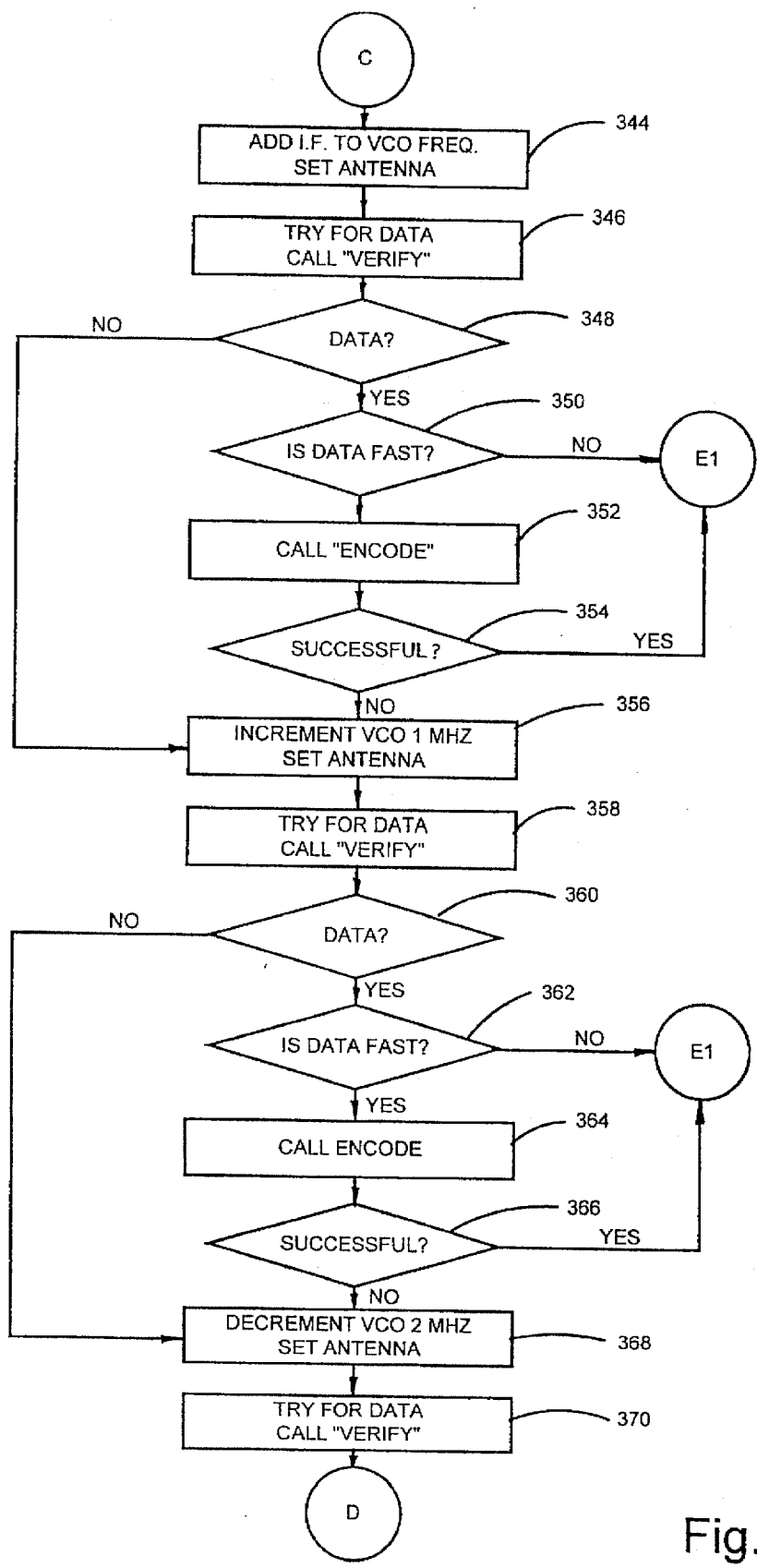
Figure 9D:
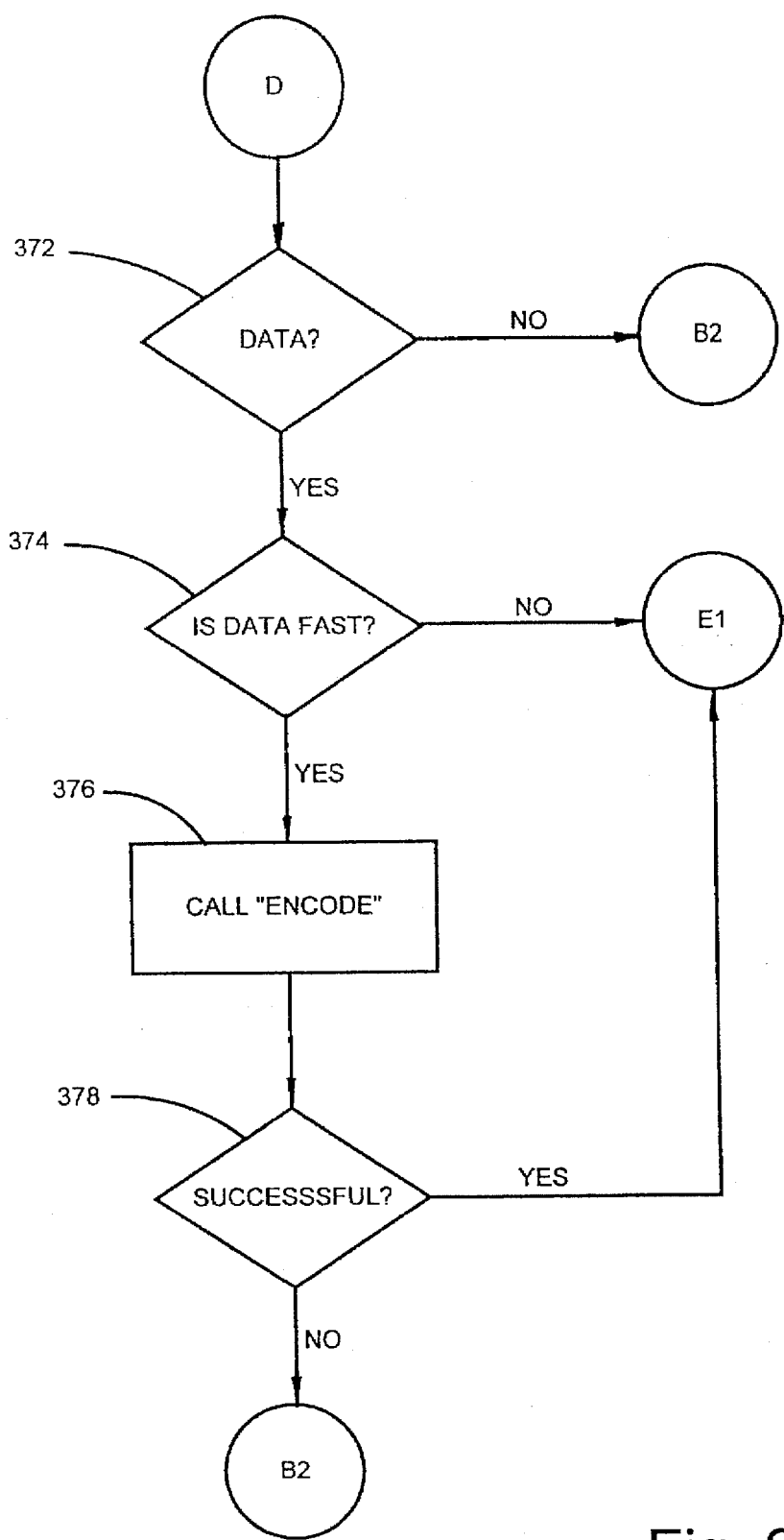

Next, the program checks to determine whether verifiable data has reappeared by calling the VERIFY subroutine in block 346 (FIG. 9C). If the program determines that data is present in block 348, the program then tests (Block 350) to determine whether the detected data is fast by examining whether the mode bit is equal to 1 or 0. If the data is fast (i.e., MODE=1), the program executed by microcontroller 57 attempts to encode this fast data in block 352 by calling the ENCODE subroutine of FIG. 11A. If the fast data is not successfully encoded (block 354), or if the program determines that data is not present in block 348, microcontroller 57 increments the VCO frequency by 1 MHz, retunes antenna 59 (block 356), and reattempts to verify the presence of data by calling the VERIFY subroutine (block 358) of FIG. 10.

If data is present (block 360), microcontroller 57 determines whether the data is fast in block 362. If the data is fast, microcontroller 57 attempts to encode this fast data by calling the ENCODE subroutine as indicated in block 364. If the fast data is not successfully encoded (block 366), or if microcontroller 57 does not detect data in block 360, microcontroller 57 decrements the VCO frequency by 2 MHz, retunes antenna 59 (block 368), and checks for the presence of data in block 370 by calling the VERIFY subroutine.

If the program then determines that data is present in block 372 (FIG. 9D), the program determines whether the detected data is fast data in block 374. If the detected data is fast data, the program attempts to encode this fast data in block 376 by calling the ENCODE subroutine. If this fast data is not successfully encoded (block 378), or if the program determines that data is not present in block 372, the program advances to block 336 (FIG. 9B) and performs the process indicated in blocks 336–342 as indicated above.

Figure 9E:
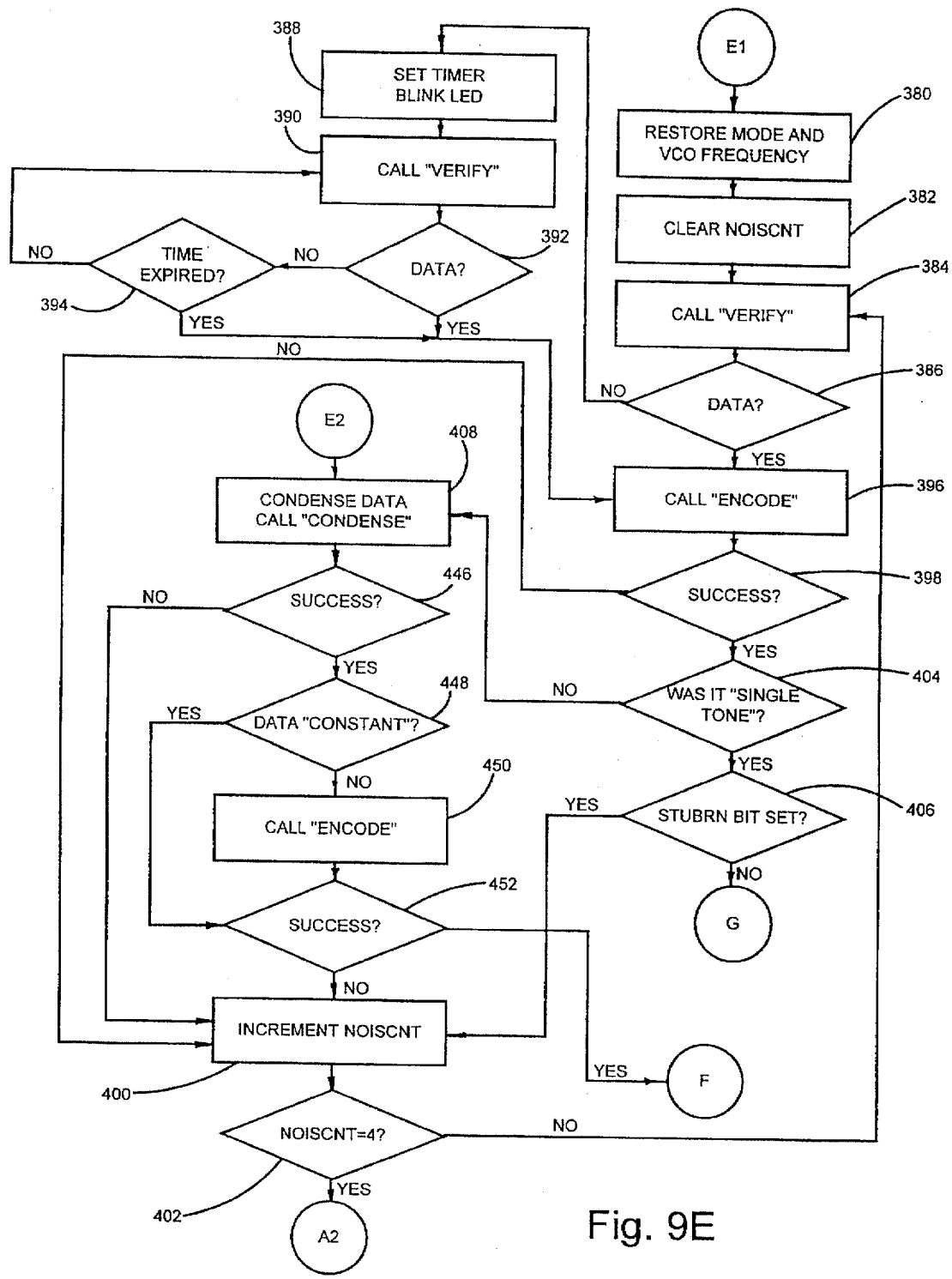
Figure 9F:
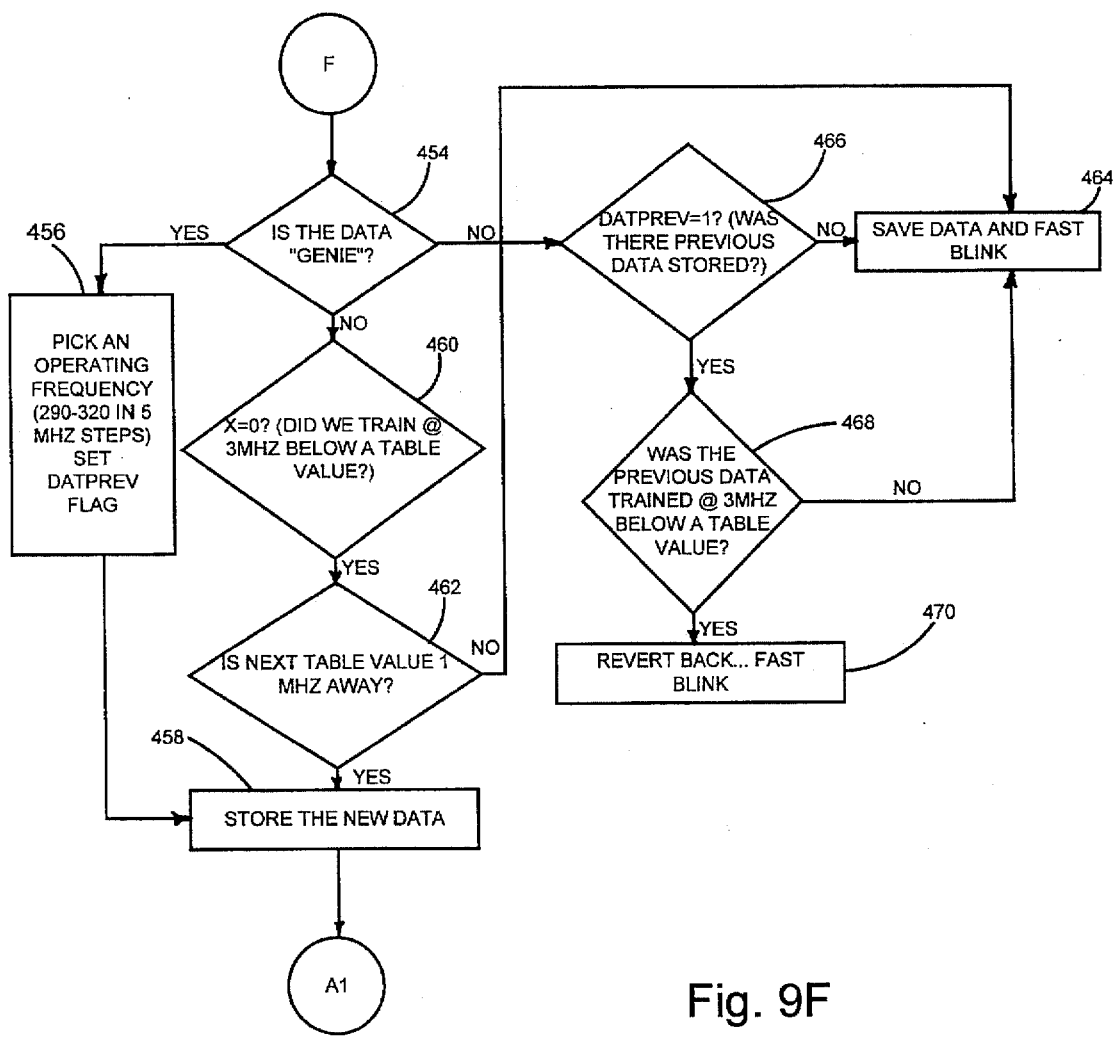

In the event the program detects data which is not fast in blocks 350, 362 (FIG. 9C), or in block 374 (FIG. 9D), the program advances to block 380 in FIG. 9E. Similarly, if the program successfully encodes detected fast data in blocks 354, 366 (FIG. 9C), or block 378 (FIG. 9D), the program advances to block 380 in FIG. 9E.

Having advanced to block 380 in FIG. 9E, the mode bit is restored to the value saved in the MODSV register and the frequency of VCO 73 is restored to the frequency at which data was first detected. Next, the noise counter NOISCNT is cleared (block 382) and the VERIFY subroutine is called in block 384. Then, if verifiable data is not present (block 386), microcontroller 57 sets a five second timer and begins slowly double blinking LED 48 in a distinctive manner in order to prompt operator to again depress the activation switch on remote transmitter 65 (block 388). Although not usually necessary, by prompting the operator to cause the remote transmitter to retransmit its activation signal, microcontroller 57 increases the likelihood that trainable transceiver 43 can successfully learn a short duration activation signal.

Next, the program repeatedly calls the VERIFY subroutine (block 390) until verifiable data is detected (block 392), or a predetermined time interval, such as five seconds, has expired (block 394). If verifiable data is detected in block 386 or block 392, or if time has expired in block 394, the program calls the ENCODE subroutine (block 396). Then, if the data is not successfully encoded (block 398), the program increments the noise counter NOISCNT (block 400) and checks whether NOISCNT is equal to 4 (block 402). If NOISCNT is not equal to 4, the program returns to block 384 to again attempt to verify and encode the received data code. If NOISCNT is equal to 4 (block 402), the program advances to block 341 in FIG. 9A where the VCO frequency and the X counter is restored and the process advances to block 250 as previously described above.

If, in block 398, it is determined that the data code was successfully encoded, the program checks whether the data was previously identified as single tone data in block 404. If the data is single tone data, the program then determines whether a stubborn (STUBRN) bit had been previously set (block 406). Initially, the STUBRN bit is not set. However, if the STUBRN bit is subsequently set in block 494 (FIG. 9G) due to an inability to previously successfully train single tone data, and the process returns back to block 406, the program increments noise counter NOISCNT in block 400 and advances through the process in the manner previously discussed above. If, in block 404, microcontroller 57 determines that the detected data is not single tone data, microcontroller 57 attempts to condense the encoded data by calling a CONDENSE subroutine in block 408. The CONDENSE subroutine is employed to attempt condense the data stored in memory during the last execution of the ENCODE subroutine such that the stored code signal, which may repeat a data sequence numerous times, does not consume more memory than necessary. The CONDENSE subroutine is now described with reference to FIG. 12.

Initially, in block 410, the program determines whether the mode bit is equal to 1. If the mode bit is equal to 1, the program determines whether any data is present with three or less periods (i.e., whether the encoded data contains a data sequence that is repeated three or fewer times within the string of data that was encoded and stored in microcontroller 57). If the data has three or less periods, the program indicates in block 414 that the attempt to condense the data has failed and returns to block 446 (FIG. 9E).

If, on the other hand, no data is present with three or less periods, the program then determines whether the encoded and stored data has any 10 kHz data with more that 30 periods (block 416). If there is 10 kHz data with more than 30 periods, the program indicates that the attempt to condense the data has failed (block 414) and returns to the process in FIG. 9E (block 446). If there is no 10 kHz data present with more than 30 periods (block 416), the program sets the start pointer of the condensed data code to the first data location of the encoded and stored data (block 418). Next, the program sets the end pointer for the stored condensed data equal to the last 10 kHz data having more than 12 periods (block 420) and indicates that the attempt to condense the data was successful (block 422) before returning to block 446 in FIG. 9E. In this manner, the stored encoded data may be condensed to a shorter form that may be repeatedly read from memory during a transmit mode.

If, in block 410, the program determines that the mode bit is not equal to 1, it then determines whether the stored encoded data includes a long low period (block 424). If the stored data does not include a long low period, it is determined in block 426 that the data is continuous and, in block 428, the program determines that the entire data bank should be used to store the encoded data. If, in block 424, it is determined that the data does include a long low period, the start pointer for the condensed data is set equal to the first location of the stored encoded data (block 430) and the end pointer of the condensed data is set equal to the last location of the long low period within the stored encoded data (block 432).

Subsequently, the program looks at the stored condensed data to determine whether the data includes any continuous logic high states of 120 samples or more (block 434). If any such continuous high logic periods are found, the program indicates that the attempt to condense the data has failed in block 436 and returns to block 446 in FIG. 9E. If there are not any consecutive high periods of 120 more samples, then the stored condensed data is examined to determine whether there are any occurrences of a logic high or low state that does not exist for two consecutive samples (block 440). If identifies such an occurrence is identified, it is indicated in block 436 that the attempt to condense the data has failed and the program advances to block 446.

If there are no such occurrences in block 440, it is determined whether the stored condensed data string from start to end is less than ten samples (block 442). If the data string is less than ten samples long, it is indicated that the attempt to condense the data has failed in block 436. On the other hand, if the stored condensed data consists of 10 or more samples, it is indicated that the attempt to condense the data was successful in block 444 and the program advances to block 446 in FIG. 9E.

In block 446 of FIG. 9E, it is determined whether the attempt to condense the encoded data was successful. If the attempt was not successful, microcontroller 57 increments the noise counter NOISCNT in block 400 and the program proceeds in the manner discussed above. If the encoded data was successfully condensed, the program determines whether the data was previously found to be constant pulse data (block 448). If the data is not constant pulse data, the program again attempts to encode the data by calling the ENCODE subroutine of FIGS. 11A–B in block 450. If the data is constant pulse data, or if the data is successfully encoded in block 450 as indicated by test block 452, the program advances to block 454 in FIG. 9F (block 452). Otherwise, the program advances to block 400 where it increments the noise counter NOISCNT and proceeds as described above.

In block 454 (FIG. 9F), the program determines whether the data is GENIE data by looking at the mode bit and the single tone bit. If the mode bit is equal to 1 and the single tone flag is not set, the program advances to block 456 where microcontroller 57 sorts the identified carrier frequency of the received activation signal into one of several known GENIE operating frequencies falling within the range of 290–320 MHz at 5 MHz intervals. Thus, for example, if the identified carrier frequency of the received activation signal is between 301 and 304 MHz, microcontroller 57 determines that the carrier frequency to store and subsequently transmit should be the closer of 300 and 305 MHz. Also in block 456, the program sets the DATPREV flag to indicate that data has been detected. Then, the program advances to block 458 and microcontroller 57 stores the new data prior to returning to block 218 in FIG. 9A.

If, in block 454, the program determines that the mode bit is not equal to 1, the program then determines whether the value of X is equal to "0" in order to determine whether data was first detected when the frequency of VCO 73 was set 3 MHz below the frequency in the frequency table (block 460). If the value of X is equal to "0", the program looks to the next value in the frequency table to determine whether this value is 1 MHz away from the previous value (block 462). If the next frequency in the frequency table is 1 MHz away, microcontroller 57 stores the new data (block 458) and the program returns to block 218 (FIG. 9A) and proceeds as described previously. If the next frequency in the frequency table is not 1 MHz away from the previous frequency, microcontroller 57 saves the data and outputs a signal causing LED 48 to rapidly blink, thus indicating a successful training sequence (block 464).

If, in block 460, the program determines that X is not equal to "0", it checks whether the DATPREV flag is equal to 1 (block 466). If the DATPREV flag is not equal to 1, microcontroller 57 saves the data and outputs a signal causing LED 48 to rapidly blink (block 464). If DATPREV flag is equal to 1, the program determines whether the previous data was trained at 3 MHz below a frequency stored in the frequency table (block 468). If the previous data was trained at 3 MHz below a frequency stored in the frequency table, microcontroller 57 reverts back to the data obtained when the VCO frequency was 3 MHz below a frequency in the frequency table and causes LED 48 to rapidly blink acknowledging a successful training sequence (block 470). If the previous data was not trained when the frequency of VCO 73 was 3 MHz below a frequency in the frequency table (block 468), microcontroller 57 saves the data and causes LED 48 to rapidly blink (block 464) indicating a successful training sequence.

Figure 9G:
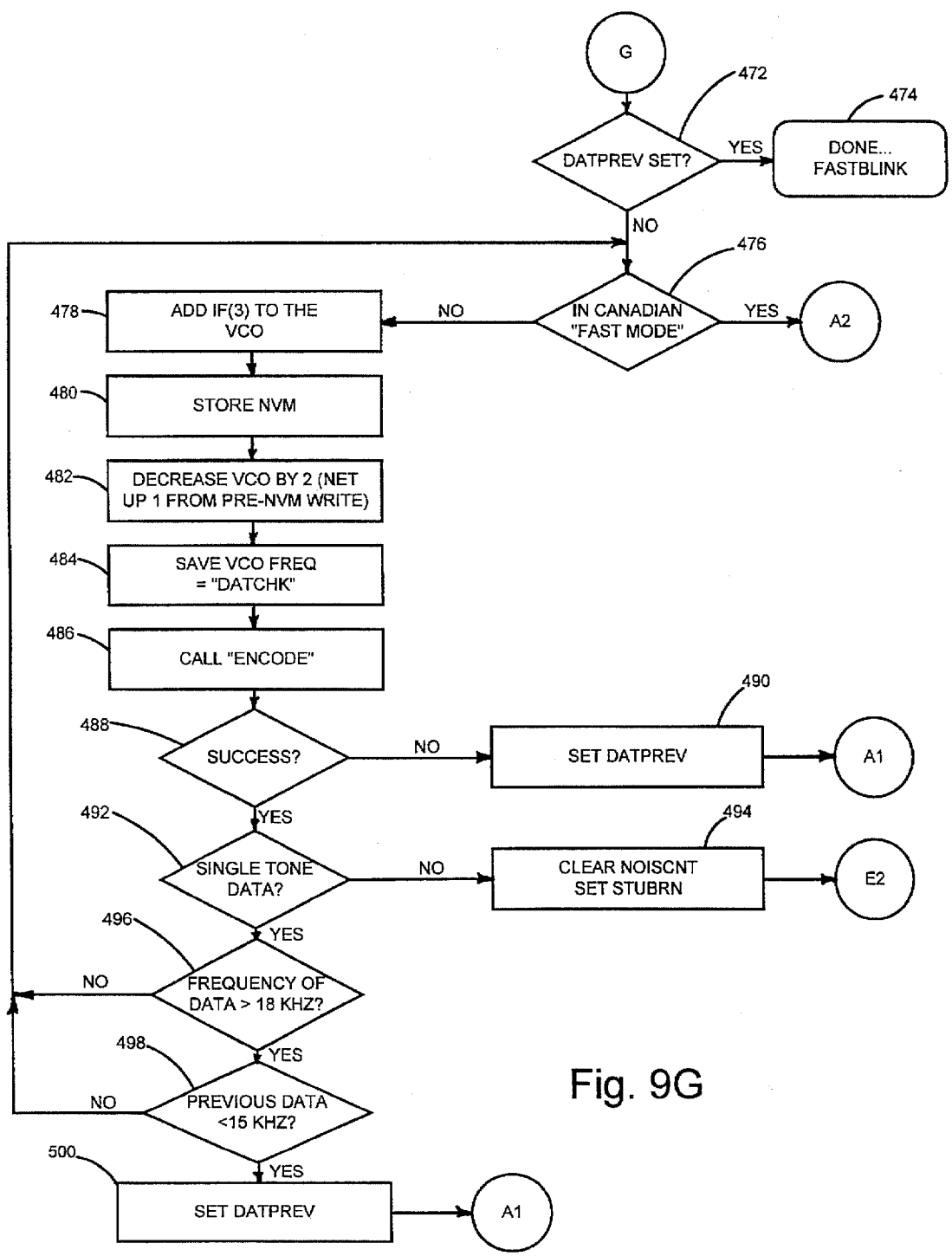

Referring back to FIG. 9E, if microcontroller 57 determines that the retrieved data code is single tone in block 404 and determines that the STUBRN bit is not set in block 406, the program advances to block 472 in FIG. 9G. In block 472, microcontroller 57 determines whether the DATPREV flag is set. If the DATPREV flag is set, microcontroller 57 causes LED 48 to rapidly blink indicating a successful training sequence (block 474). If, on the other hand, microcontroller 57 determines that the DATPREV flag is not set, microcontroller 57 determines whether it is operating in the Canadian fast mode by determining whether the last frequency read from the frequency table is a Canadian frequency (block 476). If microcontroller 57 is operating in a Canadian fast mode, the program advances to block 308 in FIG. 9A and proceeds as previously discussed. If microcontroller 57 is not operating in the Canadian fast mode, it adds the intermediate frequency of 3 MHz to the frequency of VCO 73 (block 478).

Next, microcontroller 57 stores the value of R and stores the value of N required for the increased VCO frequency in the NVM of microcontroller 57 (block 480). Next, microcontroller 57 decreases the frequency of VCO 73 by 2 MHz (block 482) and saves this frequency in the variable DATCHK (block 484). Then, the program calls the ENCODE subroutine of FIGS. 11A–B (block 486) to attempt to encode data at this new VCO frequency. If this data is not successfully encoded (block 488), the program sets the DATPREV flag (block 490) and returns to block 218 of FIG. 9A. By returning to block 218, the program may check whether data may be verified at frequencies 3 or 4 MHz below the next frequency in the frequency table. Provided verified data is not found at these frequencies, a successful train may be indicated in block 258 because the program will determine that the DATPREV flag had been set in block 256.

If, in block 488, the program determines that the attempt to encode data is successful, it determines whether the encoded data is single tone data in block 492. If the data is not single tone data, microcontroller 57 clears the noise counter NOISCNT and sets the STUBRN bit (block 494) and advances to block 480 in FIG. 9E. If the successfully encoded data is single tone data, microcontroller 57 checks the frequency of the data to determine whether it is greater than 18 kHz (block 496). Then, if the data has a frequency greater than 18 kHz, microcontroller 57 checks whether any previous data had a frequency less than 15 kHz (block 498). If any previous data did not have a frequency less than 15 kHz, or if the frequency of the successfully encoded single tone data is not greater than 18 kHz, the microcontroller program returns to block 476 and proceeds as previously discussed. If any previous data did have a frequency less than 15 kHz, the program sets the DATPREV flag (block 500) and returns to block 218 of FIG. 9A and proceeds as previously described.

The above process is continued until a successful training sequence is acknowledged or until microcontroller 57 has looked for data at all frequencies at 1 MHz intervals between the 200 and 400 MHz range, in which remote transmitters typically operate.

Although the present invention has been described as including specific elements and as operating in a specific manner in accordance with a preferred embodiment, certain aspects of the present invention may be practiced without requiring the particulars of another feature of the present invention. For example, a trainable transceiver including a dynamically tunable antenna need not also include a variable gain amplifier or the procedures for training to short duration activation signals. Similarly, the procedures for training to short duration activation signals need not be practiced with the particular structural implementation of the preferred embodiment disclosed above. For example, the short duration activation signal training procedures could be implemented in a trainable transceiver such as that disclosed in U.S. Pat. No. 5,442,340.

It will be understood by those who practice the invention and by those skilled in the art, that various modifications and improvements may be made to the invention without departing from the spirit or scope of this invention which is to be determined by the claims and by the breadth of their interpretation allowed by law.

The embodiments of the invention in which an exclusive property or privilege is claimed are defined as follows:

1. A trainable transceiver for receiving an activation signal that includes a radio frequency carrier modulated with a code and learning characteristics of the activation signal for subsequently transmitting a signal having the same characteristics for remotely actuating a device, said trainable transceiver comprising:

a memory for storing a frequency table including a first list of carrier frequencies for activation signals transmitted from remote transmitters that are known to transmit an activation signal of a duration shorter than that of most other activation signals and a second list of carrier frequencies for activation signals transmitted from remote transmitters that are known to continuously transmit an activation signal; and a controller coupled to said memory and operable in a learning and an operating mode, when in the learning mode, said controller receiving an activation signal, sequentially reading frequencies from the first list in said frequency table until a frequency is read from the first list that corresponds to a carrier frequency of the received activation signal, sequentially reading frequencies from the second list in said frequency table after all the frequencies in the first list have been read without having found a frequency in the first list that corresponds to a carrier frequency of the received activation signal, and storing frequency control data representing the frequency read from the frequency table that corresponds to the carrier frequency of received activation signal, and when in the operating mode, said controller reading said frequency control data and generating an output signal having the same carrier frequency as the received activation signal.

2. The trainable transceiver as defined in claim 1, wherein said controller selects an initial frequency after all the frequencies in said second list have been read, and increments said initial frequency until said controller receives and stores said code signal from said receiving means when in said learning mode.

3. The trainable transceiver as defined in claim 1 and further including a prompting circuit coupled to said controller for prompting an operator to cause the remote transmitter to retransmit its activation signal if the activation signal ceases before training is complete.

4. A trainable transceiver for receiving an activation signal that includes a radio frequency carrier modulated with a code and learning characteristics of the activation signal for subsequently transmitting a signal having the same characteristics for remotely actuating a device, said trainable transceiver comprising:

a memory for storing a frequency table including a first list of carrier frequencies for activation signals transmitted from remote transmitters that are known to transmit an activation signal of a duration shorter than that of most other activation signals and a second list of carrier frequencies for activation signals transmitted from remote transmitters that are known to continuously transmit an activation signal;

a controller coupled to said memory and operable in a learning and an operating mode, said controller reads a first frequency from the first list in said frequency table and generates and stores frequency control data related to the frequency read from said frequency table when in said learning mode;

a signal generator coupled to said controller for receiving said frequency control data from said controller and for generating a reference radio frequency signal having a frequency related to said frequency control data; and receiving means coupled to said controller and said signal generator for receiving an activation signal, comparing the carrier frequency of the received activation signal with the frequency of said reference radio frequency signal output from said signal generator, and providing a code signal representing the code contained in the received activation signal when a predetermined relationship exists between the carrier frequency of the received activation signal and the frequency of said reference radio frequency signal, wherein said controller sequentially reads each frequency from said first list in said frequency table and generates and provides frequency control data to said signal generator until said controller receives and stores said code signal from said receiving means or until said controller has read every frequency included in said first list when in said learning mode, said controller providing the stored code signal and frequency control data to said signal generator when in said operating mode, to generate and transmit a modulated radio frequency signal related to the received activation signal.

5. The trainable transceiver as defined in claim 4, wherein said controller selects an initial frequency after all the frequencies in said second list have been read, and increments said initial frequency until said controller receives and stores said code signal from said receiving means when in said learning mode.

6. A trainable transceiver for receiving an activation signal that includes a radio frequency carrier modulated with a code and learning characteristics of the activation signal for subsequently transmitting a signal having the same characteristics for remotely actuating a device, said trainable transceiver comprising:

receiving means for receiving an activation signal from an operator-actuated remote transmitter and providing a code signal representing the code contained in the received activation signal;

a controller coupled to said receiving means and operable in a learning and an operating mode, said controller receiving said code signal from said receiving means while executing a training sequence in said learning mode, and generating a code signal and output frequency control data in said operating mode; and a prompting circuit coupled to said controller for prompting an operator to cause the remote transmitter to retransmit its activation signal if the activation signal ceases before training is complete, wherein, if the activation signal ceases before training is complete, said controller interrupts the training sequence and signals the prompting circuit to prompt the operator to cause the remote transmitter to retransmit its activation signal, and when the activation signal is retransmitted and received, said controller resumes execution of the training sequence from a position in the training sequence at which the training sequence was interrupted.

7. The trainable transceiver as defined in claim 6 and further including:

a signal generator coupled to said controller and to said receiving means for receiving said reference frequency control data from said controller, generating a reference signal having a frequency corresponding to said reference frequency control data, providing said reference signal to said receiving means, receiving said code signal and said output frequency control data, and for generating a modulated radio frequency signal having a relationship to the received activation signal, wherein said receiving means provides said code signal to said controller when a predetermined relationship exists between the carrier frequency of the received activation signal and the frequency of said reference signal provided by said signal generator, and said controller changes the reference frequency control data provided to said signal generator until said receiving means provides said controller with said code signal.

8. The trainable transceiver as defined in claim 7 and further including a memory for storing a frequency table including a first list of carrier frequencies for activation signals transmitted from remote transmitters that are known to transmit an activation signal of a short duration, wherein said controller sequentially reads each frequency from said first list in said frequency table and generates and provides reference frequency control data to said signal generator until said controller receives and stores said code signal from said receiving means or until said controller has read every frequency included in said first list when in said learning mode.

9. The trainable transceiver as defined in claim 8, wherein said frequency table further includes a second list of carrier frequencies for activation signals transmitted from remote transmitters that are known to continuously transmit an activation signal, said controller sequentially reads frequencies from said second list after all the frequencies in said first list have been read.

10. The trainable transceiver as defined in claim 9, wherein said controller selects an initial frequency after all the frequencies in said second list have been read, and increments said initial frequency until said controller receives and stores said code signal from said receiving means when in said learning mode.

11. A method using a trainable transceiver for learning an activation signal that remotely actuates a device, the method comprising the steps of:

(a) receiving an activation signal from a remote transmitter;

(b) reading a first frequency from a frequency table including a first list of carrier frequencies for activation signals transmitted from remote transmitters that are known to transmit an activation signal of a duration shorter than that of most other activation signals and including a second list of carrier frequencies for activation signals transmitted from any known remote transmitters that do not have a carrier frequency included in the first list of carrier frequencies;

(c) generating a reference signal having a frequency related to the frequency read from the frequency table;

(d) mixing the reference signal with the received activation signal and providing a mixed output signal;

(e) filtering the mixed output signal to provide a code included in the received activation signal when the frequency of the reference signal has a predetermined relation to the radio frequency of the received activation signal;

(f) sequentially reading a next frequency from the frequency table with the frequencies in the first list being read prior to the frequencies in the second list;

(g) repeating steps (c) through (f) to vary the frequency of the reference signal until the predetermined relation between radio frequency of the received activation signal is obtained and the radio frequency of the received activation signal is identified; and (h) generating and storing radio frequency control data, which indicates the identified radio frequency and code of the received activation signal.

12. The method as defined in claim 11 and further including the step of prompting an operator to cause the remote transmitter to retransmit its activation signal if the activation signal ceases before training is complete.

13. A method using a trainable transceiver for learning an activation signal that remotely actuates a device, comprising the steps of:

(a) receiving an activation signal from a remote transmitter;

(b) selecting an initial frequency;

(c) generating a reference signal having a frequency that is related to the selected frequency;

(d) mixing the reference signal with the received activation signal and providing a mixed output signal;

(e) filtering the mixed output signal to provide a code included in the received activation signal when the frequency of the reference signal has a predetermined relation to the radio frequency of the received activation signal;

(f) prompting an operator to cause the remote transmitter to retransmit its activation signal if the activation signal ceases before training is complete;

(g) selecting a different frequency and repeating steps (c) through (g) to vary the frequency of the reference signal until the predetermined relation between radio frequency of the received activation signal is obtained and the radio frequency of the received activation signal is identified;

(h) generating and storing radio frequency control data, which indicates the identified radio frequency and code of the received activation signal.

14. The method as defined in claim 13, wherein the step of selecting a different frequency includes incrementing the selected frequency by a predetermined increment.

15. The method as defined in claim 13, wherein the steps of selecting an initial frequency and selecting a different frequency include sequentially reading frequencies from a frequency table including a list of carrier frequencies for activation signals transmitted from known remote transmitters.

16. The method as defined in claim 15, wherein the frequency table includes a first list of carrier frequencies for activation signals transmitted from remote transmitters that are known to transmit an activation signal of a short duration.

17. The method as defined in claim 16, wherein the frequency table further includes a second list of carrier frequencies for activation signals transmitted from any known remote transmitters that do not have a carrier frequency included in the first list of carrier frequencies, and wherein the step of sequentially reading a next frequency from the frequency table includes reading a first frequency in the second list if a last frequency in the first list was previously read.

* * * * *

UNITED STATES PATENT AND TRADEMARK OFFICE
CERTIFICATE OF CORRECTION

Page 1 of 1

PATENT NO.       : 5,699,055
APPLICATION NO.  : 08/446085
DATED            : December 16, 1997
INVENTOR(S)      : Dykema et al.

It is certified that error appears in the above-identified patent and that said Letters Patent is hereby corrected as shown below:

On the Title page item "[75] Inventors: Kurt A. Dykema; Paul C. Duckworth, all of Holland, Mich."

Should read: "[75] Inventors: Kurt A. Dykema; Paul C. Duckworth, all of Holland, Mich. and Fred Bassali, Great Neck, NY."

Signed and Sealed this
Seventeenth Day of March, 2015

Michelle K. Lee
*Director of the United States Patent and Trademark Office*